(12) United States Patent
Dabral et al.

(10) Patent No.: US 11,728,266 B2
(45) Date of Patent: Aug. 15, 2023

(54) DIE STITCHING AND HARVESTING OF ARRAYED STRUCTURES

(71) Applicant: Apple Inc., Cupertino, CA (US)

(72) Inventors: Sanjay Dabral, Cupertino, CA (US);
Jun Zhai, Cupertino, CA (US);
Kunzhong Hu, Cupertino, CA (US);
Raymundo M. Camenforte, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/133,096

(22) Filed: Dec. 23, 2020

(65) Prior Publication Data
US 2022/0199517 A1    Jun. 23, 2022

(51) Int. Cl.
*H01L 23/528*    (2006.01)
*H01L 23/58*    (2006.01)
(Continued)

(52) U.S. Cl.
CPC .......... *H01L 23/528* (2013.01); *H01L 23/585* (2013.01); *H01L 24/08* (2013.01); *H01L 24/16* (2013.01); *H01L 24/32* (2013.01); *H01L 25/18* (2013.01); *H01L 2224/08145* (2013.01); *H01L 2224/16145* (2013.01); *H01L 2224/16265* (2013.01); *H01L 2224/32145* (2013.01)

(58) Field of Classification Search
CPC ..... H01L 23/585; H01L 23/498–49894; H01L 23/538–5389; H01L 23/3128; H01L 23/528; H01L 23/535; H01L 25/042; H01L 25/0655; H01L 25/072; H01L 25/0753; H01L 25/115; H01L 21/4846–4867; H01L 21/4807–481; H01L 21/74; H01L 2224/08145; H01L 2224/16145; H01L 2224/32145; H01L 24/08–09; H10K 30/00; H10K 50/00; H10K 59/00; H10K 71/00; H10K 85/00; H10K 99/00; H10N 10/00; H10N 30/00; H10N 35/00; H10N 50/00; H10N 52/00; H10N 60/00
See application file for complete search history.

(56) References Cited

U.S. PATENT DOCUMENTS 10,438,896 B2    10/2019   Dabral et al.
10,763,239 B2     9/2020   Chen et al.
(Continued)

OTHER PUBLICATIONS

J.S. Choi, "Next Big Thing: DDR4 3DS", received from https://www.jedec.org/sites/default/files/files/JS_Choi_Server_Forum2014(1).pdf, JEDEC, 2014, 19 pages.

(Continued)

*Primary Examiner* — Victor A Mandala
*Assistant Examiner* — Lawrence C Tynes, Jr.
(74) *Attorney, Agent, or Firm* — Aikin & Gallant, LLP

(57) ABSTRACT

Multi-die structures with die-to-die routing are described. In an embodiment, each die is patterned into the same semiconductor substrate, and the dies may be interconnected with die-to-die routing during back-end wafer processing. Partial metallic seals may be formed to accommodate the die-to-die routing, programmable dicing, and various combinations of full metallic seals and partial metallic seals can be formed. This may also be extended to three dimensional structures formed using wafer-on-wafer or chip-on-wafer techniques.

14 Claims, 26 Drawing Sheets

(51) Int. Cl.
    *H01L 25/18*     (2023.01)
    *H01L 23/00*     (2006.01)

(56) References Cited

U.S. PATENT DOCUMENTS

| | | |
|---|---|---|
| 2009/0160029 A1 | 6/2009 | Pitts et al. |
| 2018/0294230 A1* | 10/2018 | Dabral .................... H01L 25/18 |
| 2019/0181170 A1 | 6/2019 | Oishi et al. |
| 2020/0075497 A1* | 3/2020 | Dabral .................... H01L 24/24 |
| 2020/0105682 A1 | 4/2020 | Liu et al. |
| 2020/0176419 A1 | 6/2020 | Dabral et al. |

OTHER PUBLICATIONS

Daly, Denis C., "Through the Looking Glass-2020 Edition", received from https://ieeexplore.ieee.org/stamp/stamp.jsp?tp=&arnumber=8967270, IEEE Solid-State Circuits Magazine, 2020, 17 pages.

IBM, "POWER9—Microarchitectures—IBM" received from https://en.wikichip.org/wiki/ibm/microarchitectures/power9, WikiChip, Aug. 2017, 15 pages.

"ASML Products & Services: Supplying the Semiconductor Industry." ASML Products & Services | Supplying the Semiconductor Industry, <www.asml.com/en/products>, accessed from the Internet On Dec. 23, 2020.

K.K, Hamamatsu Photonics "Stealth Dicing™ Process vs. Ordinary Dicing Methods" Stealth Dicing™ Process, sd. hamamatsu.com/jp/en/SD_outline/SD_comparison.html. accessed from the Internet On Dec. 23, 2020.

"DISCO Corporation", recieved from https://www.disco.co.jp/eg/index.html, accessed from the Internet On Dec. 23, 2020. 5 pages.

* cited by examiner

2X Capacity

Phy (distance)

DIE STITCHING AND HARVESTING OF ARRAYED STRUCTURES

BACKGROUND

Field

Embodiments described herein relate to integrated circuit (IC) manufacture, and the interconnection of multiple dies.

Background Information

Microelectronic fabrication of ICs is typically performed using a sequence of deposition and patterning of circuit elements in a layer-by-layer sequence in which a stepper (or scanner) is used to pass light through a reticle, forming an image of the reticle pattern on an underlying layer. Rather than expose an entire wafer, the stepper moves in steps across the wafer from one die area location to another. In this manner, working on a limited area enables higher resolution and critical dimensions. Dies can then be scribed from the wafer and further packaged.

A multi-chip module (MCM) is generally an electronic assembly in which multiple dies are integrated on a substrate. Various implementations of MCMs include 2D, 2.5D and 3D packaging. Generally, 2D packaging modules include multiple dies arranged side-by-side on a package substrate. In 2.5D packaging technologies multiple dies and bonded to an interposer with microbumps. The interposer in turn is then bonded to a package substrate. The interposer may include routing to interconnect the adjacent die. Thus, the dies in 2.5D packaging can be directly connected to the interposer, and are connected with each other through routing within the interposer. Generally, 3D packaging modules include multiple dies stacked vertically on top of each other. Thus, the die in 3D packaging can be directly connected to each other, with the bottom die directly connected to a package substrate. The top die in a 3D package can be connected to the package substrate using a variety of configurations, including wire bonds, and through-silicon vias (TSVs) through the bottom die.

More recently it has been proposed in U.S. Pat. No. 10,438,896 to connect adjacent dies formed in the same substrate with stitch routing. Thus, the back-end-of-the-line (BEOL) build-up structure commonly reserved for individual die interconnection can be leveraged to for die-to-die routing to connect adjacent die areas in the same substrate. In this manner, die sets can be scribed from the same wafer. Furthermore, these die sets can be larger than a single reticle size. These die sets can then be further integrated in various modules or semiconductor packages.

SUMMARY

Multi-device structures are described in which the devices, including dies and other components, are harvested from arrayed structures. Adjacent devices within a harvested die set or component set can be co-located or connected together with die-to-die or component-to-component routing. Partial metallic seals may also be formed to accommodate the die-to-die routing or component-to-component routing, and various combinations of full metallic seals and partial metallic seals can be formed. Programmable dicing techniques can additionally be employed to selectively scribe custom die/component sets, at high densities and without being limited to a specific scribe size or shape. Furthermore, programmable dicing techniques can also be used to scribe unique structures where additional area or structure can be included in the scribed die set adjacent to a partial metallic seal to provide further protection from environment (e.g. moisture, ions), stress, and micro-cracks.

DETAILED DESCRIPTION

Figure 1A:
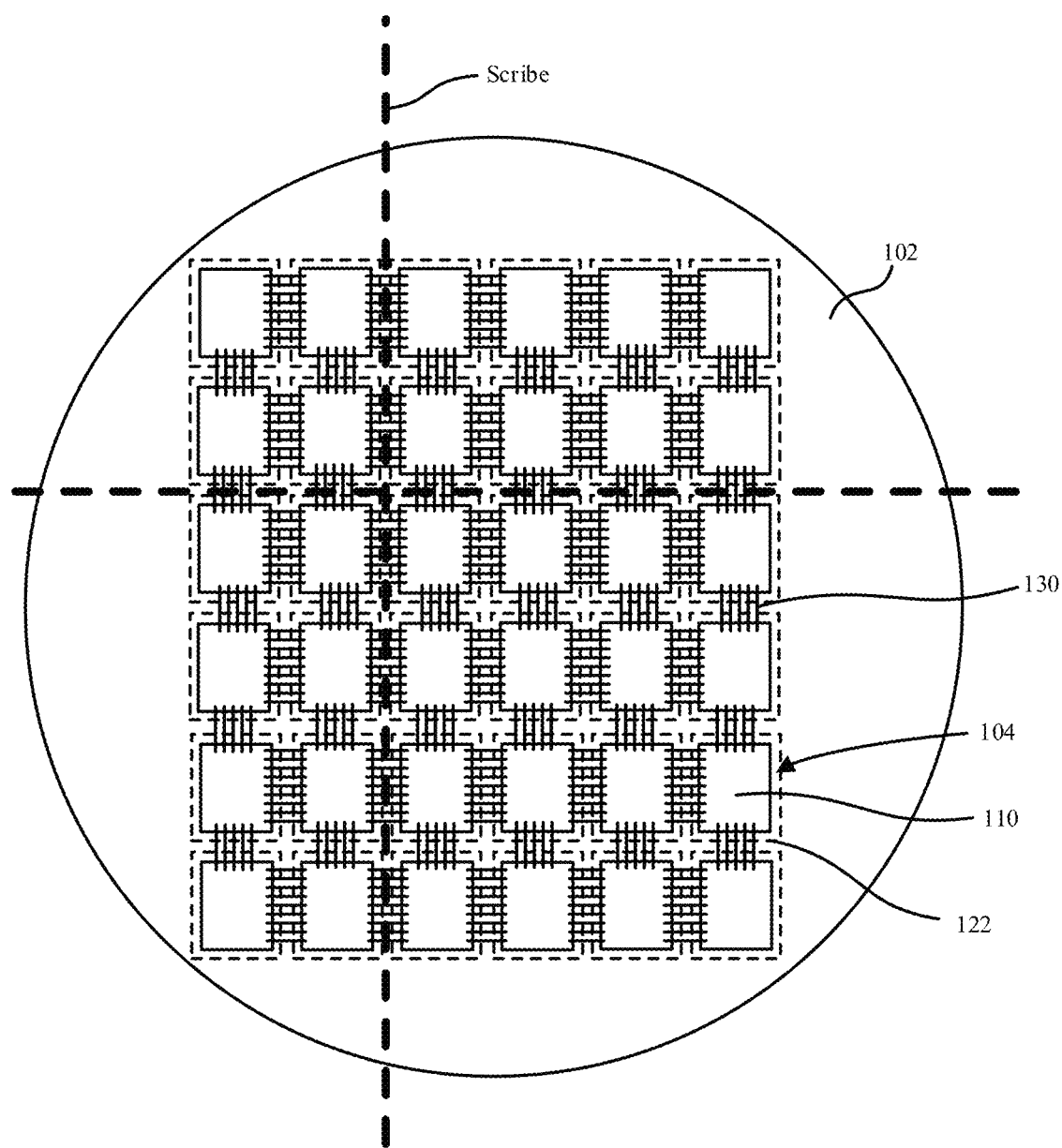
FIGS. 1A-1B are schematic top view layout plan illustrations of a wafer including an array of front-end-of-the-line (FEOL) die areas in accordance with embodiments in which adjacent FEOL die areas are interconnected with die-to-die routing.

Embodiments describe multi-device structures obtained from harvesting of arrayed structures, and either co-locating the adjacent devices or using stitching techniques to connect adjacent devices. Harvesting may include dicing the number of units required, or even having more units than required and accepting one or more units that fail. Additionally, redundancy can be added by including one or more extra units (dies), or complete sub-systems. In event of a unit failure, a good unit can be swapped. Redundancy can be at the time of manufacture, or swappable in the field. Various applications include harvesting of engines such as graphics processing units (GPU), central processing units (CPU), signal processing engines, a neural engines (e.g. neural network processing engine), artificial intelligence (AI) engines, networks, caches, etc., memory device such as static random-access memory (SRAM), magnetic random-access memory (MRAM), nonvolatile random-access memory (NVRAM), dynamic random-access memory (DRAM), NAND, and cache memory, other components such as a capacitor, inductor, resistor, power management integrated circuit (IC), amongst others including interfacing bars for logic or memory expansion, and interposer substrates. Array harvesting may also be extended to other applications including solar, display, probe pin arrays for automated test equipment (ATE), field programmable gate arrays (FPGA), etc.

In one aspect, embodiments describe multi-die structures including combinations of partial metallic seals (e.g. partial metallic seal rings) around or over certain edges of front-end-of-the-line (FEOL) die areas in combination with full rings. In this manner, partial metallic seals can be located in areas where die-to-die or component-to-component interconnections are possible, while full metallic seals or metallic seal rings can be located around edges where such connections are not intended. In accordance with some embodiments, die-to-die routings (interconnects) or component-to-component routing (interconnects) can be pre-formed, and desired die sets can then be scribed from a source wafer. Scribing may optionally include cutting through the die-to-die routing.

In another aspect, embodiments describe programmable dicing techniques where traditional dicing techniques such as blade sawing will not work. For example, this may include laser assisted dicing or chemical etch dicing flows to carve out specific die-set areas, which can also be irregularly shaped. Laser techniques may be ablation based (evaporate the material) or stealth (damage the semiconductor wafer, then fracture). Chemical may be wet etch or plasma etch, particularly if the semiconductor wafer (silicon) is deep (e.g. more than 50 µm). Thus, such programmable dicing techniques can facilitate harvesting of arrayed structures. Furthermore, such programmable dicing techniques can facilitate dicing through non-conventional FEOL die areas. For example, dicing can be performed through a portion of an adjacent FEOL die area of a die that is to be scrapped in order to increase chip edge to active area distance of the harvested die, and provide further protection to moisture, ions, cracks where a partial metallic seal ring may be present.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1B:
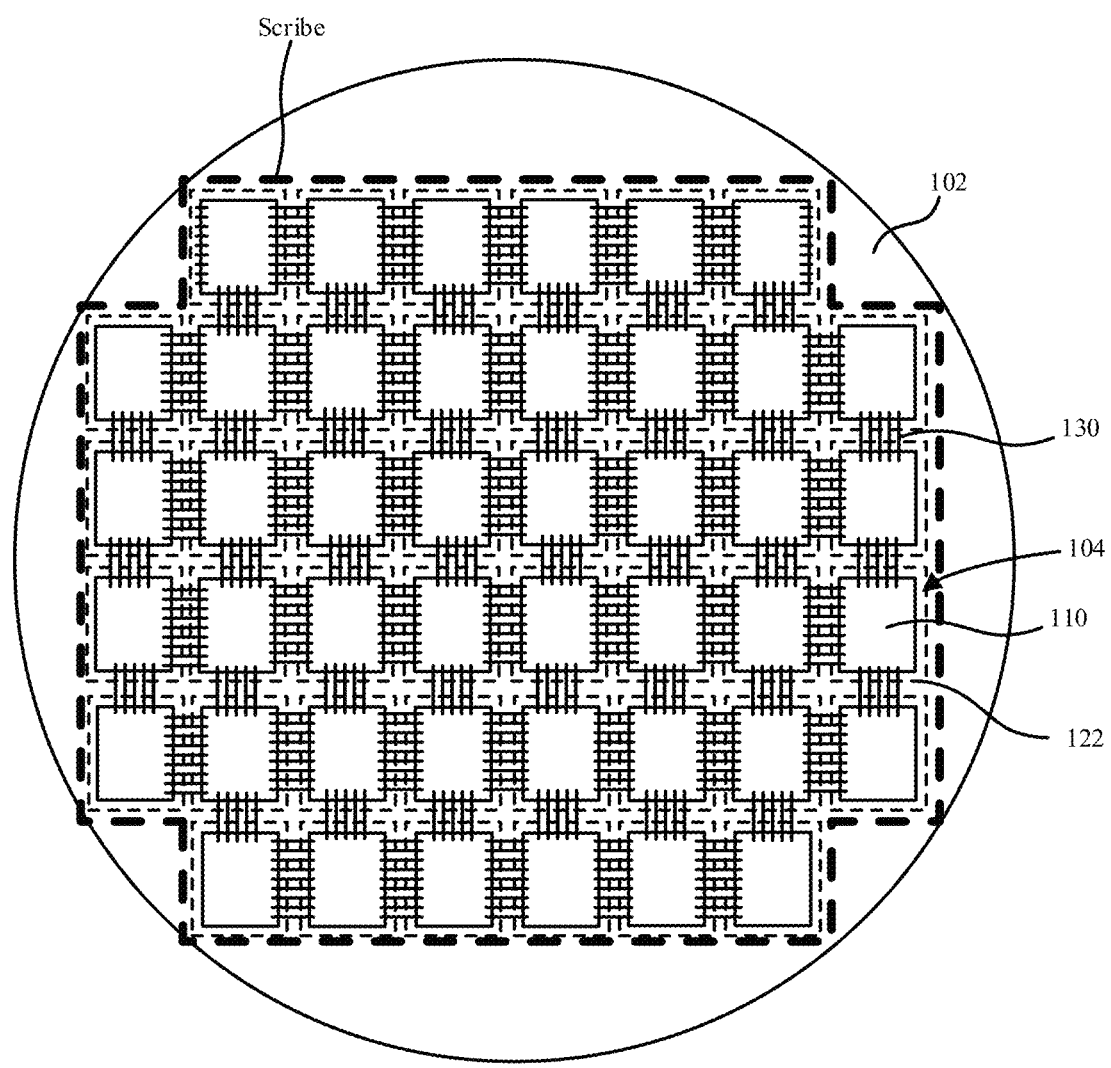

Referring now to FIGS. 1A-1B schematic top view layout plan illustrations are provided of a wafer 102 (e.g. silicon) including an array of dies 104 in which the adjacent FEOL die areas 110 of the dies 104 can be interconnected with die-to-die routing 130. The separate FEOL die areas 110 and dies 104 in accordance with embodiments described herein (not limited to FIGS. 1A-1B) may include distinct circuit blocks from one another. Each die area 110 may represent a complete system, or sub-system. Adjacent die areas 100 may perform the same or different function. In an embodiment, die area 110 interconnected with die-to-die routing can include a digital die area tied to a die area with another function, such as analog, wireless (e.g. radio frequency, RF) or wireless input/output, by way of non-limiting examples. The tied die areas 110 may be formed using the same processing nodes, whether or not having the same or different functions. Whether each die 104 and die area 110 includes a complete system, or are tied subsystems, the die-to-die routing 130 may be inter-die routing (different systems) or intra-die routing (different, or same subsystems within the same system). For example, intra die-to-die routing may connect different subsystems within a system on chip, SOC, where inter die-to-die routing can connect different SOCs, though this is illustrative, and embodiments are not limited to SOCs.

In accordance with embodiments, any or all FEOL die area edges can be configured to include die-to-die routing 130. Furthermore, each FEOL die area 110 may be surrounded by metallic seal 122 (e.g. metallic seal ring), which can be a partial or full metallic seal. In an embodiment, partial metallic seals (or partial metallic seal rings) may be provided around or over FEOL die area edges where die-to-die routing 130 can be formed. As shown in FIG. 1A, dicing or scribe lanes can be located anywhere to accommodate yield (e.g. bad dies) or demand (e.g. need for larger die sets). As shown in FIG. 1B, the harvesting techniques in accordance with embodiments can facilitate improved wafer utilization, and harvesting of more dies or components. For example, this may be accomplished by being able to harvest die sets of different or irregular shapes, as well as utilizing programmable dicing methods. It is to be appreciated that while the following description is made with specific regard to interconnection of adjacent FEOL die areas with die-to-die routing 130, such a configuration is also applicable to interconnection of adjacent component areas with component-to-component routing.

Figure 1C:
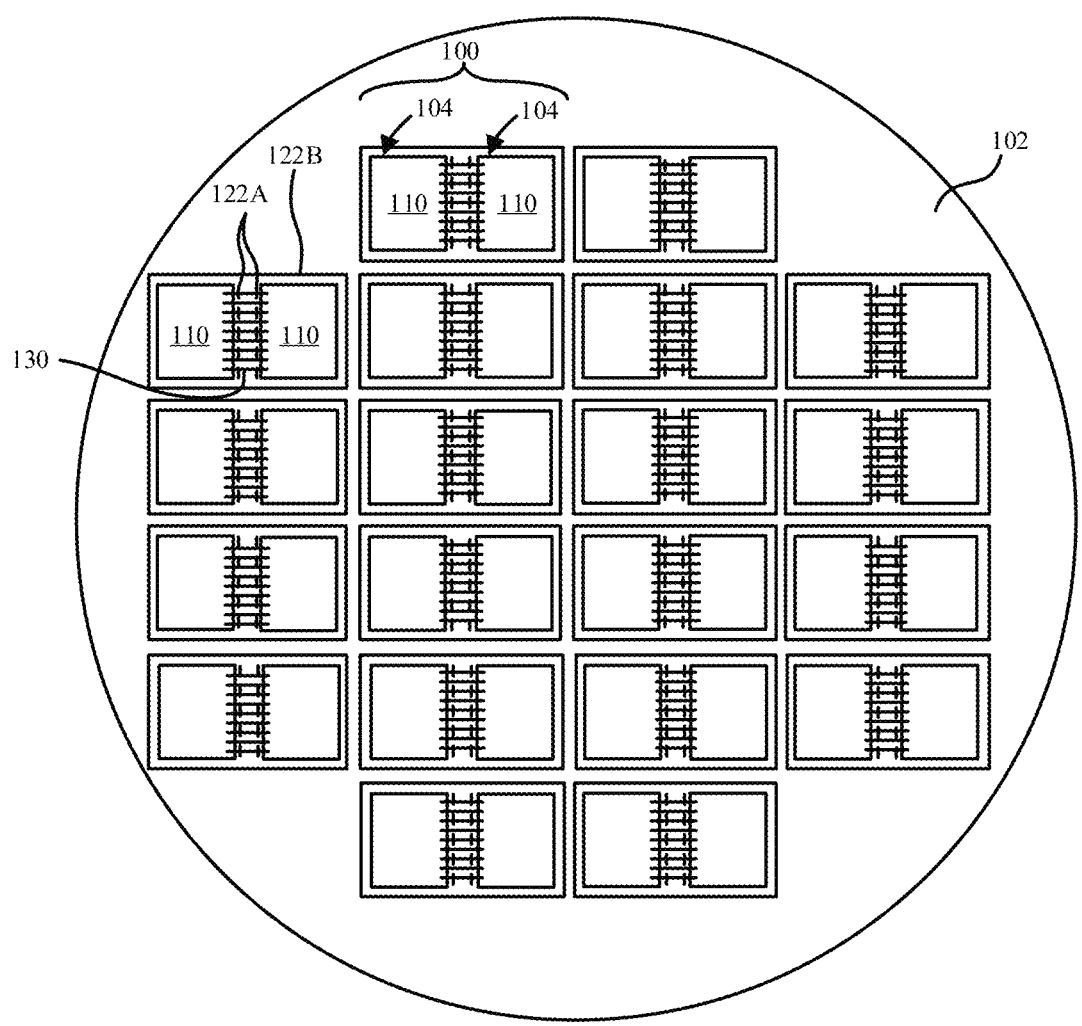
FIG. 1C is a schematic top view layout plan illustration of a wafer including an array of FEOL die area sets in accordance with an embodiment in which the FEOL die area sets are interconnected with die-to-die routing.

FIG. 1C is a schematic top view layout plan illustration of a wafer including an array of pre-arranged die sets 100 in accordance with an embodiment in which the die sets 100 are interconnected with die-to-die routing 130. While the array of FEOL die areas 110 illustrated in FIGS. 1A-1B can allow for complete flexibility with scribing any combination of interconnected die sets, embodiments such as that illustrated in FIG. 1C also contemplate the arrangement of specific die sets connected with die-to-die routing. In such an embodiment, full metallic seal rings 122B can be provided around the die sets 100, while partial metallic seals 122A are provided between adjacent FEOL die areas 110 within the die sets 100. Such a configuration may allow for complete metallic sealing of the scribed die sets, while still allowing for flexibility of scribing through the die-to-die routing 130 between adjacent FEOL die areas to facilitate improved wafer utilization. For example, such scribing may be performed to harvest a single die 104, remove a bad die 104, or harvest an irregular shape or custom number of dies 104 in a die set 100. As a contrast with FIG. 1A, which may be across multiple reticles, the embodiment illustrated in FIG. 1C may be within a reticle suitable for smaller systems. Staying within reticle may allow simpler stitching interconnection. Dicing can also be through the die-to-die routing 130 between die areas.

Figure 2:
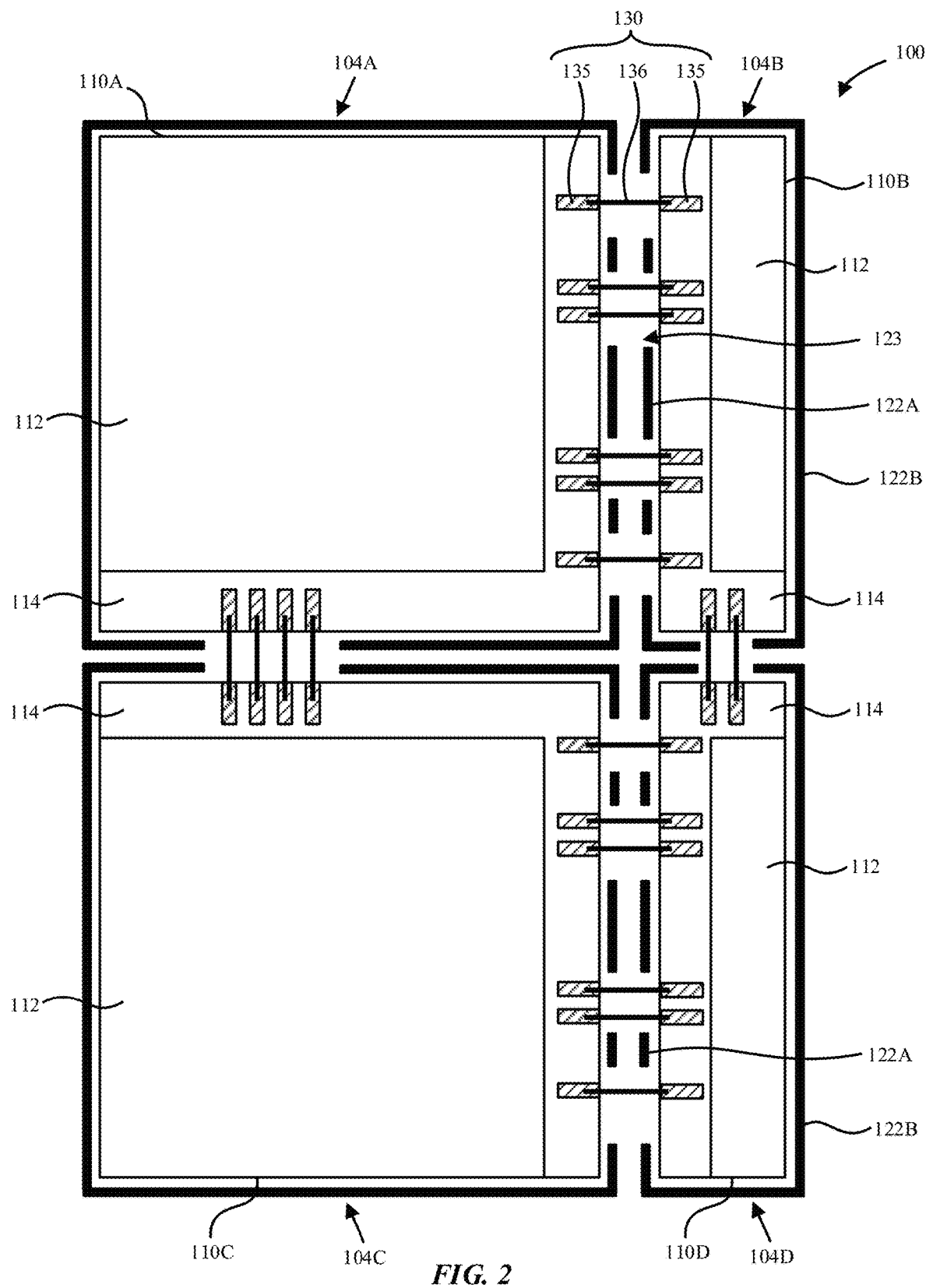
FIG. 2 is a schematic top view illustration of a plurality of adjacent FEOL die areas in accordance with an embodiment in which die-to-die routing extends through partial metallic seal rings around the FEOL die areas.

In order to illustrate flexibility of integrating partial and full metallic seals reference is made to FIG. 2. As shown, die-to-die routing 130 can extend through partial metallic seals 122A between adjacent FEOL die areas 110A, 110B, 110C, 110D, of dies 104A, 104B, 104C, 104D and full metallic seals 122B can optionally be arranged adjacent FEOL die area 110A, 110B, 110C, 110D edges that are not interconnected with die-to-die routing 130. Each die can include an FEOL die area that includes a device area 112 and input/output region(s) 114. The metallic seals in accordance with embodiments may provide physical protection (e.g. from environment (e.g. moisture, ions), stress, micro-cracks, delamination) and/or electrical protection (e.g. electromagnetic interference, electrostatic discharge). Thus, partial metallic seals 122A can be incorporated to provide design flexibility for harvesting interconnected die sets, while full metallic seals 122B can be incorporated to provide more robust physical and/or electrical protection to the die sets 100.

FIG. 2 also illustrates that the die sets 100 can include dies with different shapes (e.g. different sized FEOL die areas 110) as well as, the same or different types and function of dies. As previously described with regard to FIGS. 1A-1B, the separate FEOL die areas 110A, 110B, 110C, 110D and dies 104A, 104B, 104C, 104D may include distinct circuit blocks from one another. Each die area may represent a complete system, or sub-system. Adjacent die areas may perform the same or different function. In an embodiment, die areas 110A, 110B, for example, interconnected with die-to-die routing can include a digital die area tied to a die area with another function, such as analog, wireless (e.g. radio frequency, RF) or wireless input/output, by way of non-limiting examples. The tied die areas may be formed using the same processing nodes, whether or not having the same or different functions. Whether each die and die area includes a complete system, or are tied subsystems, the die-to-die routing 130 may be inter-die routing (different systems) or intra-die routing (different, or same subsystems within the same system). For example, intra die-to-die routing may connect different subsystems within a system on chip, SOC, where inter die-to-die routing can connect different SOCs, though this is illustrative, and embodiments are not limited to SOCs. In an embodiment, a die set 100 includes both digital and analog or wireless die areas 110. In an embodiment, the different dies 104 with a die set 100 can include multiple engines, such as a graphics processing unit (GPU), a central processing unit (CPU), a neural engine (e.g. neural network processing engine), an artificial intelligence (AI) engine, a signal processor, networks, caches, and combinations thereof. However, embodiments are not limited to engines, and may include memory devices, such as SRAM, MRAM, DRAM, NVRAM, NAND, cache memory, or other components such as a capacitor, inductor, resistor, power management integrated circuit (IC), amongst others.

Figure 3:
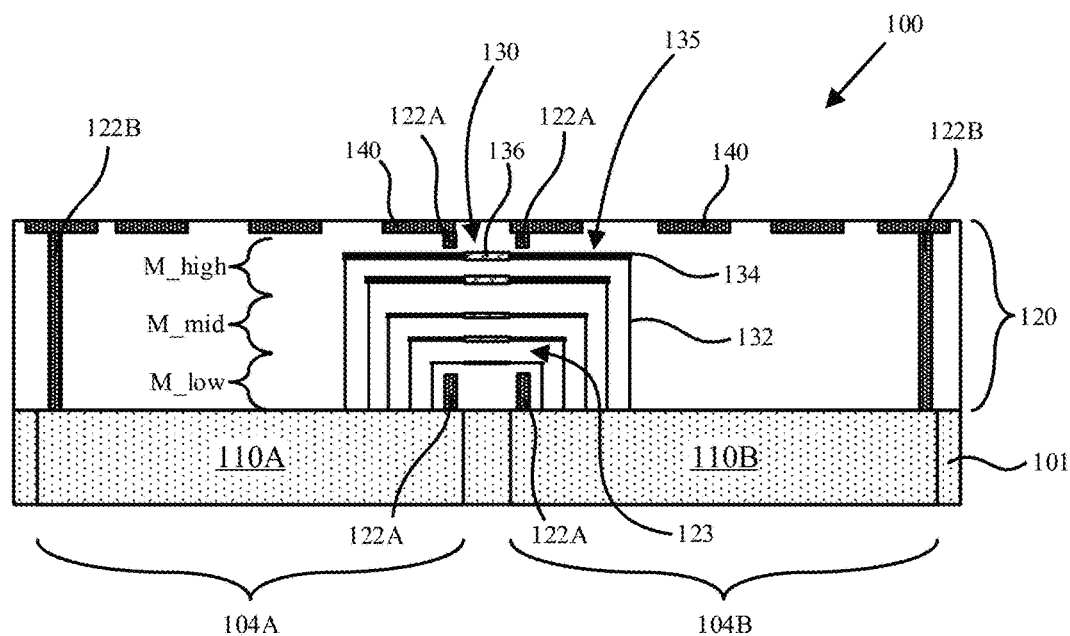
FIG. 3 is a schematic cross-sectional side view illustration of a stitched die structure in accordance with an embodiment.

Referring now to FIG. 3 in combination with FIG. 2, a schematic cross-sectional side view illustration is provided of a stitched die structure in accordance with an embodiment. As shown, each FEOL die area 110A, 110B is formed in the same (semiconductor) substrate 101, such as a silicon wafer. Each FEOL die area 110A, 110B can include the active and passive devices of the dies. A back-end-of-the-line (BEOL) build-up structure 120 is then formed over the semiconductor substrate 101 to provide electrical interconnections and metallic seal structures. The BEOL build-up structure 120 may conventionally fulfill the connectivity requirements of the die. In accordance with embodiments, connectivity of the BEOL build-up structure 120 is extended to connect different dies. The BEOL build-up structure 120 may be fabricated using conventional materials including metallic wiring layers (e.g. copper, aluminum, etc.) and insulating interlayer dielectrics (ILD) such as oxides (e.g. silicon oxide, carbon doped oxides, etc.), nitrides (e.g. silicon nitride), low-k, materials, etc.

The die-to-die routing 130 may include die routing 135 from each die connected with stitch routing 136. In accordance with embodiments, the die routing 135 may be formed from one or more vias 132 and metal layers 134 within the BEOL build-up structure 120. In the particular embodiment illustrated, the die-to-die routing 130 includes multiple routings, formed within multiple metal layers. In accordance with embodiments, the die-to-die routing 130 can be formed within the lower metal layers M_low, upper metal layers M_high, midlevel metal layers M_mid, and combinations thereof. Generally, the lower metal layers M_low have finer line widths and spacing. Additionally, the interlayer dielectrics (ILDs) for the lower metal and midlevel metal layers may be formed of low_k materials, which can allow quicker moisture transport. Thus, when using the finer wiring layers, additional precautions can be taken in accordance with embodiments, such as passivation of diced chip edges. This may be attributed to making connections between devices. The upper metal layers M_high may have coarser line widths and line spacing, with the midlevel metal layers M_mid having intermediate line widths and spacing. In an embodiment, upper metal layers M_high may be primarily used for die-to-die routing 130 for lower resistance wiring, and possibly greater flexibility to form custom die sets with dynamic die-to-die routing 130 after testing. In accordance with embodiments, the die-to-die routing 130 extends through one or more openings 123 in the partial metallic seals 122A to electrically connect the dies 104. The BEOL build-up structure 120 may additionally include a plurality of contact pads 140 such as, but not limited to, under bump metallurgy pads, which may be electrically connected to the first and second die 104A, 104B, and optionally the metallic seals 122A, 122B.

Still referring to FIGS. 2-3, die sets 100 including stitched multi-die structures in accordance with embodiments may include a first front-end-of-the line (FEOL) die area 110A of a first die 104A patterned into a semiconductor substrate 101 and a second FEOL die area 110B of a second die 104B patterned into the semiconductor substrate 101, with the second FEOL die area 110B being separate from the first FEOL die area 110A. The first FEOL die area can include a first input/output region 114, and the second FEOL die area can includes a second input/output region 114. The BEOL build-up structure 120 additionally spans over the first FEOL die area 110A and the second FEOL die area 110B. As shown in both FIGS. 2-3 a first partial metallic seal 122A may be adjacent to the first input/output region 114 of the first FEOL die area 110A, and a second partial metallic seal 122A may be adjacent to the second input/output region 114 of the second FEOL die area 110B. As shown in both FIGS. 2 and 3, die-to-die routing 130 connects the first input/output region 114 and the second input/output region 114 and extends through first openings 123 in the first partial metallic seal 122A and second openings 123 in the second partial metallic seal 122A. In an embodiment, the openings 123 are lateral openings. For example, the openings 123 may be similar to a gate opening in a fence. In an embodiment, the openings 123 are vertical openings. For example, the openings 123 may be similar to a window in a wall between a floor and ceiling, or open kitchen service counter for illustrative purposes. Openings 123 can assume different shapes, and combinations of lateral and vertical characterizations.

As shown in FIG. 2, each die 104 may include a partial metallic seal 122A adjacent to a portion or side/periphery of the die, adjacent multiple sides, or around all sides. Each die 104 may include a combination of full metallic seals 122B and partial metallic seals 122A to accommodate die-to-die routing 130. Furthermore, larger full metallic seals 122B can be formed around multiple dies, such as in FIG. 1C where full metallic seal rings 122B are provided around the die sets 100, while partial metallic seals 122A are provided between adjacent FEOL die areas 110 within the die sets 100 that may be stitched together. A variety of combinations are possible.

Figure 4:
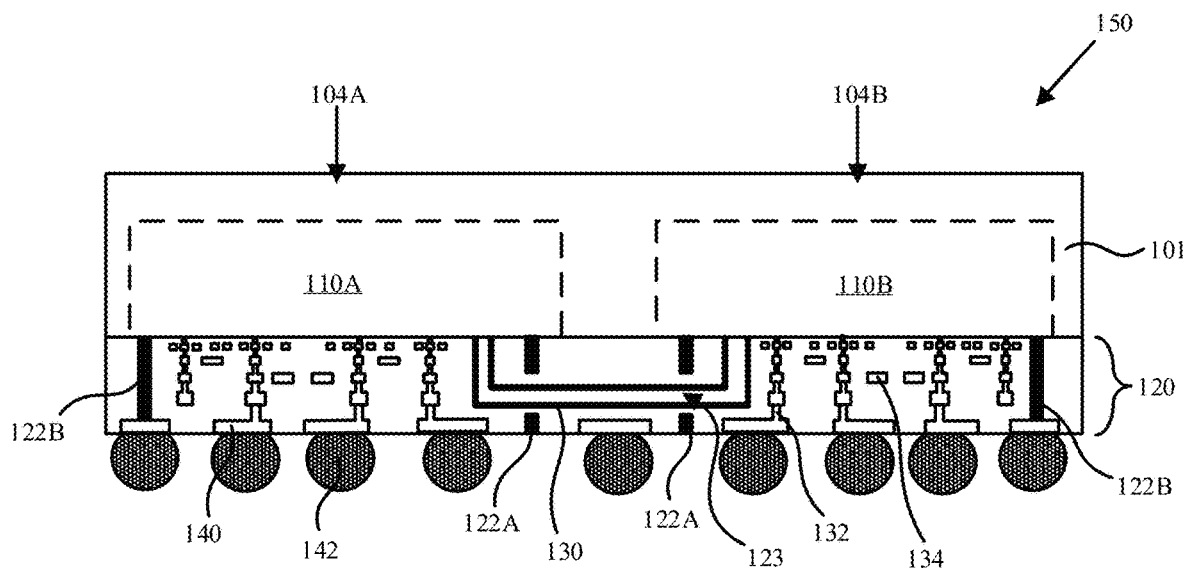
FIG. 4 is a schematic cross-sectional side view illustration of a chip including a stitched die structure in accordance with an embodiment.

FIG. 4 is a schematic cross-sectional side view illustration of a chip 150 including a stitched die structure in accordance with an embodiment. The particular embodiment illustrated includes a die set 100 similar that of FIG. 3 and FIG. 1C, which can be diced from the semiconductor wafer 102. The chip 150 can be further packaged, or a plurality conductive bumps (e.g. solder) 142 can be provided to contact pads 140. The illustration of FIG. 4 differs from the schematic of FIG. 3 and shows more traditional damascene structures for vias 132 and metal layers 134 within the BEOL build-up structure 120. Additionally, vertical openings 123 are illustrated within the partial metallic seals 122A to accommodate the die-to-die routing 130.

Figure 5A:
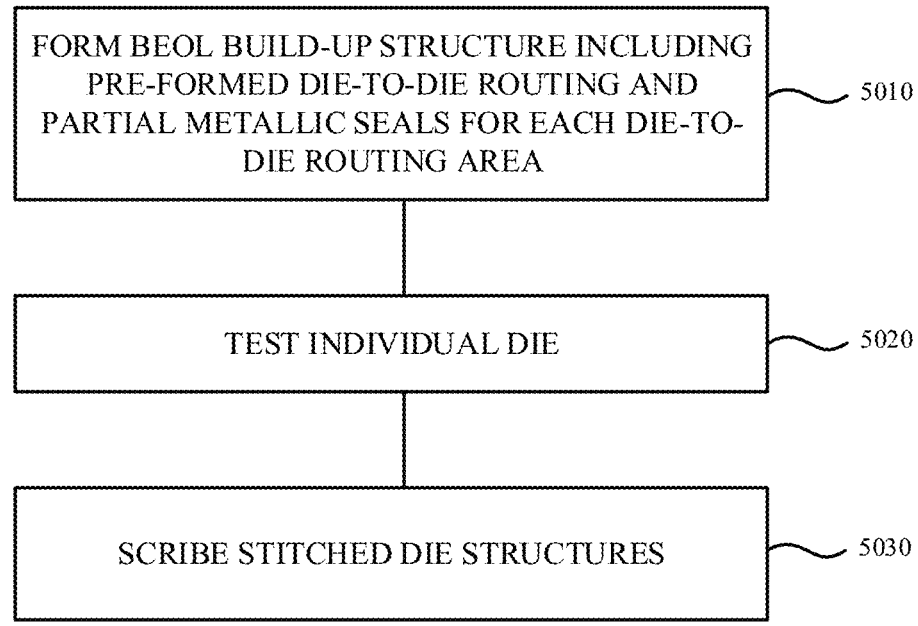
FIG. 5A is a flow chart of a method of testing and scribing dies with pre-formed die-to-die routing extending through partial metallic seal rings accordance with embodiments.

FIG. 5A is a flow chart of a method of testing and scribing dies with pre-formed die-to-die routing 130 extending through partial metallic seals 122A accordance with embodiments. Referring briefly back to FIGS. 1A-1C and FIG. 2, exemplary arrangements are provided with different arrangements of partial metallic seals 122A and full metallic seals 122B. In an exemplary fabrication sequence at operation 5010 the BEOL build-up structure 120 is formed to include pre-formed die-to-die routing 130 extending through partial metallic seals 122A. The individual dies 104 can then be tested at operation 5020. Testing may be performed at wafer level with contacting circuit probes with die test pads, which can be interspersed with contact pads 140. In this arrangement, the partial metallic seals 122A can allow connectivity between the dies and a test engine on the wafer to enhance testing. In accordance with embodiments, testing may be used to bin the dies into groups, for example, to identify good and bad die clusters. Die sets 100 within good clusters may then be dynamically scribed out into specified stitched die structures at operation 5030.

Figure 5B:
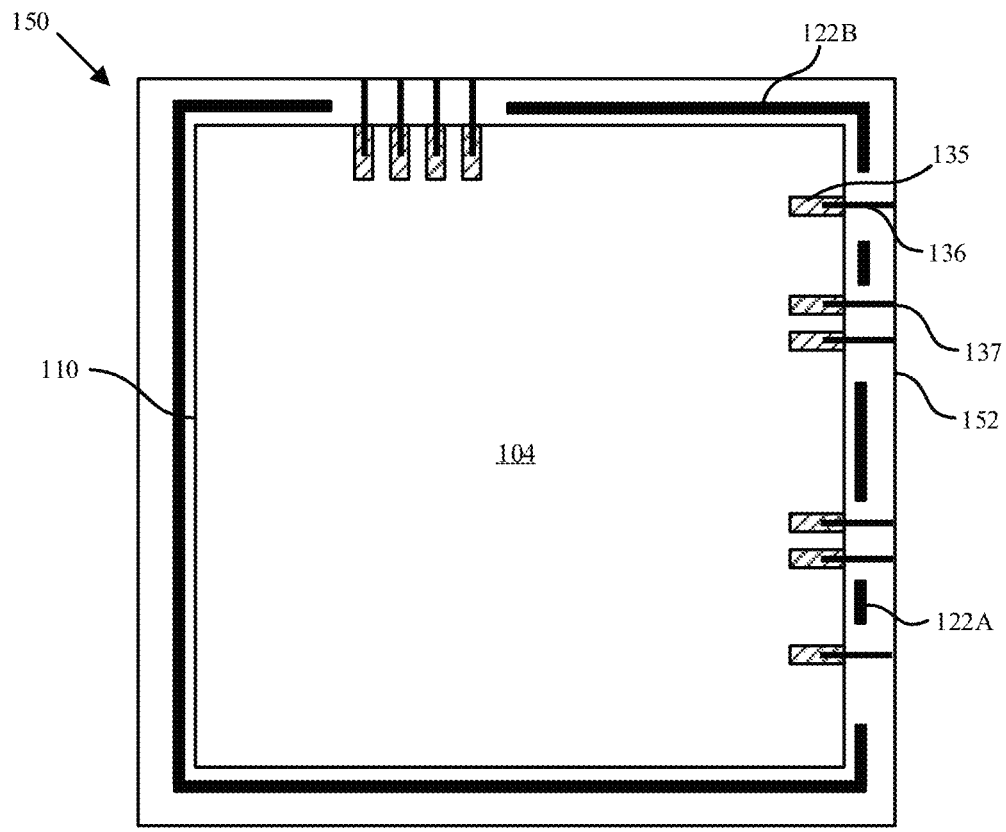
FIG. 5B is a schematic top view illustration of a die including scribed die-to-die routing in accordance with an embodiment.

Up until this point the die sets 100 illustrated in FIGS. 2 and 3 do not show scribing through the die-to-die routing 130. However, scribing or cutting may also be performed through die-to-die routing 130 when scribing die sets 100 or individual dies 104. FIG. 5B is a schematic top view illustration of chip 150 included a harvested die 104 with scribed die-to-die routing 130 in accordance with an embodiment. As shown in FIG. 5B scribing may be accompanied by cutting through the die-to-die routing 130, or more specifically through stitch routing 136, or optionally die routing 135, or both. Scribing through the die-to-die routing 130 may then result in terminal ends 137 of the die-to-die routing (which is now unconnected between dies), which will thus be along a diced edge 152 of the resultant chip 150 or package. However, since this cut portion of the die-to-die routing 130 will not be used, this may not affect performance of the stitched die 104. In an embodiment, the die-to-die routing 130 lines (and associated power supply network), which have been cut, are electrically isolated. Isolation can include being tristated, or otherwise being disconnected from the core circuits of the die. Following dicing the die 104 or die sets 100 may be further integrated as discrete chips 150 or subjected to further packaging sequences.

In an embodiment, a chip 150 structure may include a semiconductor substrate 101, a first FEOL die area 110 (e.g. 110A, FIG. 2) of a first die 104 patterned into the semiconductor substrate 101, with the first FEOL die area 110 including a first device area 112 and a first input/output region 114. A BEOL build-up structure 120 spans over the first device area 112 and the first input output region 114, and a chip edge 152 is adjacent to the first input output region 114. In this example, it can be assumed dicing is between dies 104A, 104B of FIG. 2. In accordance with embodiments, the BEOL build-up structure 120 includes a die-to-die routing 130 connected between the first input/output region 114 and a terminal end 137 of die-to-die routing 130 at the chip edge 152 (See FIG. 5B). In an embodiment, the first input/output region 114 connected to the die-to-die routing 130 is isolated in an off state. Isolation can include being tristated or otherwise being disconnected from the core circuits of the die. As shown, the BEOL build-up structure 120 can include a first partial metallic seal 122A adjacent to the first input/output region 114, with the die-to-die routing 130 extending through first openings 123 in the first partial metallic seal 122A.

Die-to-die routing 130 may be included along one, a plurality, or all die edges. In an embodiment, a second FEOL die area 110 (e.g. 110C, FIG. 2) of a second die 104 may also be patterned into the same semiconductor substrate 101, with the second FEOL die area 110 including a second device area 112 and a second input output region 114. In an embodiment, the first FEOL die area 110 (e.g. 110A) includes a third input/output region 114, and the BEOL build-up structure 120 spans over the second FEOL die area 110 (e.g. 110C), the second input/output region 114, and the third input/output region 114, and the BEOL build-up structure 120 additionally includes a second die-to-die routing 130 connected between the second input/output region and the third input/output region. Further, a second partial metallic seal 122A may be adjacent to the second input/output region 114 and a third partial metallic seal 122A may be adjacent to the third input/output region 114, with the second die-to-die routing 130 extending through second openings 123 in the second partial metallic seal 122A and through third openings 123 in the third partial metallic seal 122A.

Figure 6A:
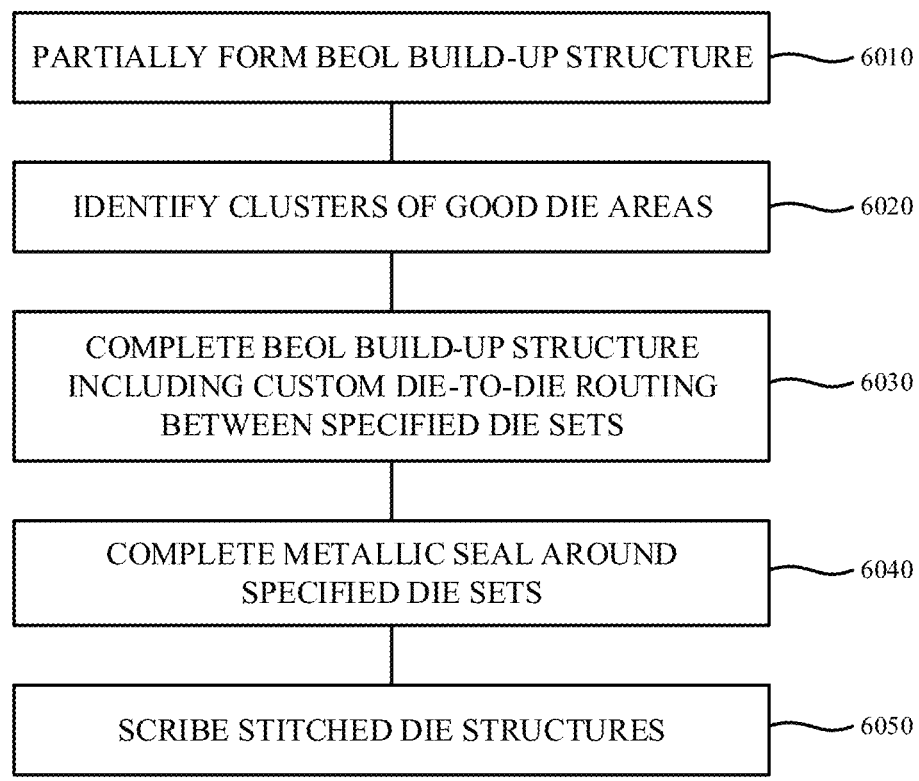
FIG. 6A is a flow chart of a method of testing and scribing dies with full metallic seal rings accordance with embodiments.
Figure 6B:
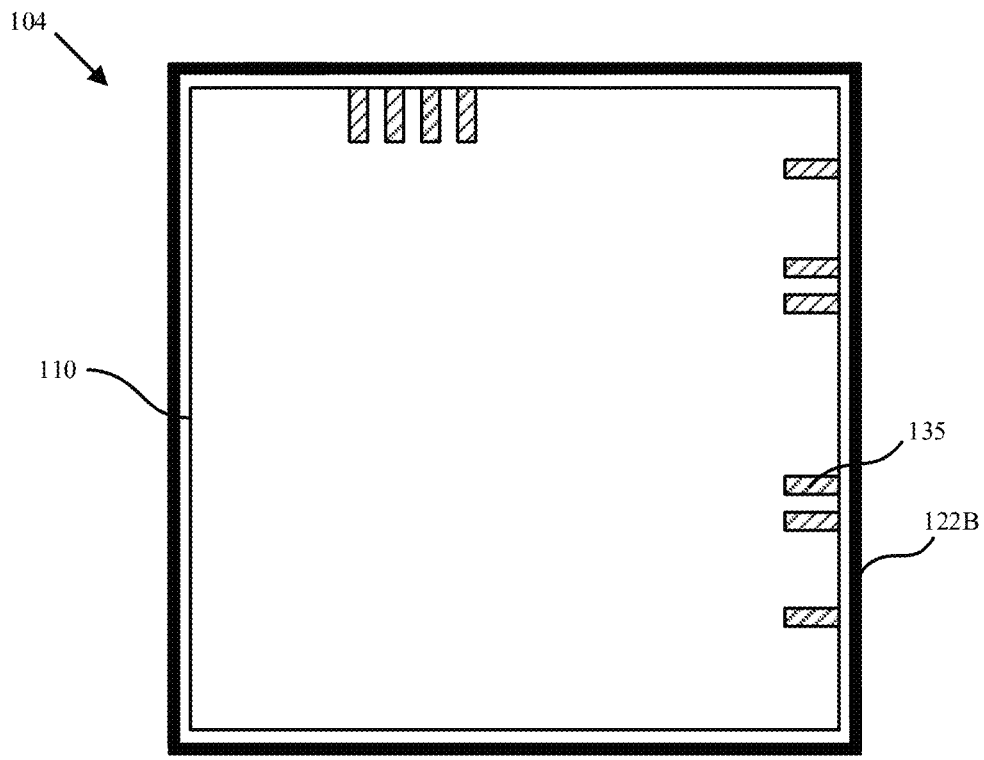
FIG. 6B is a schematic top view illustration of a die including a full metallic seal ring in accordance with an embodiment.

Thus far embodiments have been described in which the die-to-die routing 130 and metallic seals are pre-formed. In alternative processing sequences, custom seal rings can be formed after die testing. FIG. 6A is a flow chart of a method of testing and scribing dies with full metallic seals 122B accordance with embodiments. FIG. 6B is a schematic top view illustration of a die 104 including a full metallic seal 122B in accordance with an embodiment, which may be fabricated using the sequence of FIG. 6A. At operation 6010 the BEOL build-up structure 120 is only partially formed. That is, a significant portion of the metal routing is formed, yet processing has not continued to the point of fabricating the bond pads. At this stage processing of the metal routing has not yet reached the point for conventional wafer testing methods. At operation 6020 die clusters are binned (e.g. identified as good or bad) based on process data. For example, the process data may be based on early electrical test data from front-end-of-the-line (FEOL) and/or early BEOL fabrication stages, optical test data, and yield trends for wafer die location. Data may include electrical test or optical inspection data. For example, electrical test data may include probed (touch) tests to determine electrical quality of transistors or interconnects, simple circuits (e.g. ring oscillator or the like). Probed touchdown testing may be accompanied by a subsequent clean/repair operation. No-touch testing may also be utilized to bin the dies. Exemplary no-touch testing methods include optical inspection, and systematic (e.g. wafer maps) and historical trends, and project yield to identify the die sets. No-touch testing may include radio frequency, or optical probes, or probing on a remote area with test signals propagated to the die under test. Based on this information, the formation of the BEOL build-up structure 120 is completed at operation 6030 to include die-to-die routing 130 between specified die sets. Dies 104 within bad clusters may not be interconnected. Specifically, stitch routing 136 may not be formed over pre-formed die routing 135 as shown in FIG. 6B, which can remain unconnected and buried inside the BEOL build-up structure 120. In some embodiments, full metallic seals 122B are only formed around the specified die sets that will become the stitched die sets 100 at operation 6040, or single die sets as shown in FIG. 6B. In this manner, the uncommitted layers of the BEOL build-sup structure 120 can then be used to form the custom metallic seals, routings, and die sets. The die sets 100 are then scribed at operation 6050.

The harvesting methods in accordance with embodiments can be used for integration of a variety of arrayed structures of other components which may be active or passive, such as capacitors, inductors, resistors, power management integrated circuits (ICs), amongst others including interfacing bars for logic or memory expansion. Active structures include silicon-based structures as well as other types of materials suitable for electronic devices such as GaAs, InP, etc. Array harvesting may also be extended to other applications including solar, display, prob pin arrays for automated test equipment (ATE), field programmable gate arrays (FPGA), etc.

Figure 7:
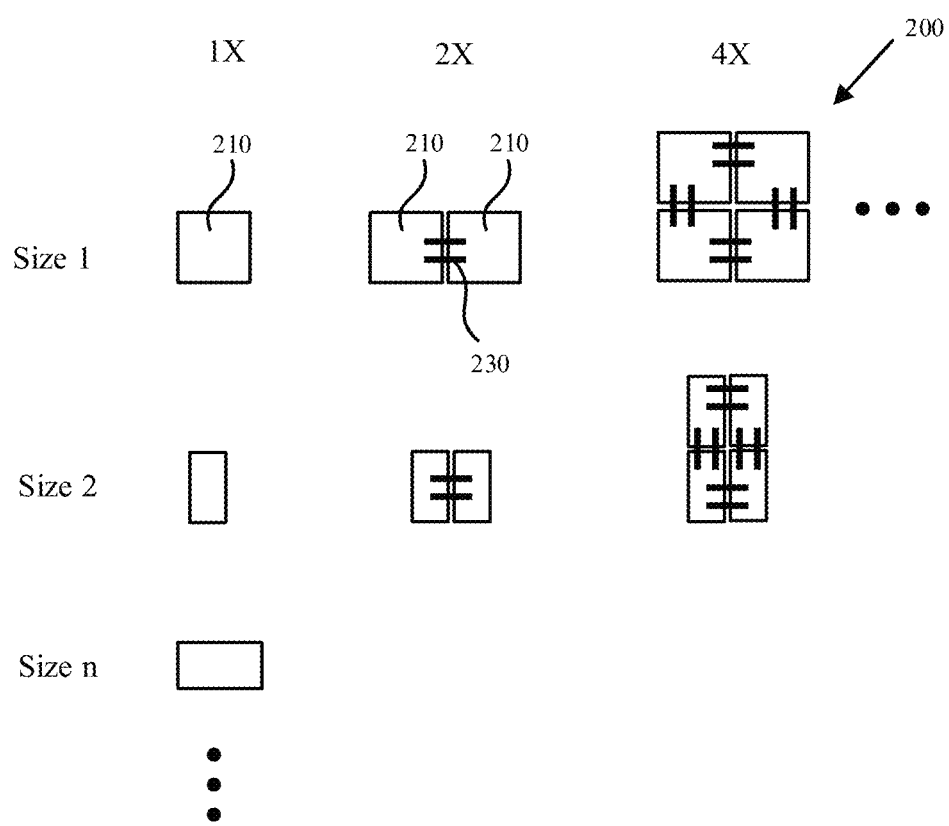
FIG. 7 is a schematic top view illustration multi-component device scaling with connected co-located components in accordance with an embodiment.

FIG. 7 is a schematic top view illustration multi-component device scaling with connected/stitched co-located components 210 in accordance with an embodiment. The general idea of FIG. 7 is similar to the die harvesting idea of FIGS. 1A-1C, where it is shown that multi-component devices 200 can be harvested from a substrate including an array of components 210. Similarly, the components can have prefabricated component-to-component routing 230, or can have custom component-to-component routing as previously described with the die sets 100. Multiple components 210 can be interconnected in a multi-component device 200 using component-to-component routing 230, for example for capacity scaling. For example, where the components 210 are passive devices such as resistors, capacitors, or inductors, the components 210 can be appropriately connected to obtain desired properties (e.g. parallel capacitors to increase capacitance). Physical properties like aspect ratio, or other desirable non-rectangular shapes may be feasible. Similarly, other passive properties may be suitably tailed, such as inductance, resistance, etc. In such an embodiment, the multi-component device 200 may have shared terminals 205 (see FIGS. 8A-8B) for mounting on a chip or package with microbumps 190. Alternatively, each of the components 210 can be co-located and not electrically connected to one another. In such a circumstance, the components 210 within a multi-component device 200 can each have their own terminals 205. As shown, the component harvesting can be used to select different sizes or shapes of components and component sets.

Figure 8A:
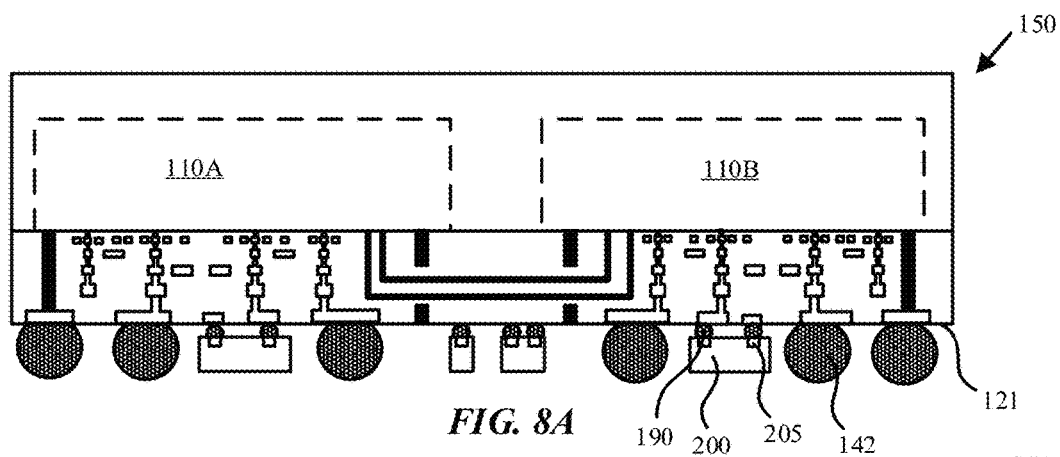
FIG. 8A is a schematic cross-sectional side view illustration of a chip including a plurality of multi-component devices in accordance with an embodiment.

Referring now to FIG. 8A, a schematic cross-sectional side view illustration is provided of a chip 150, such as that previously described with regard to FIG. 4, including a plurality of multi-component devices 200 in accordance with an embodiment. As shown, the multi-component devices 200 can be mounted onto an underside 121 of the BEOL build-up structure 120 adjacent to the conductive bumps 142. The multi-component devices 200 may have different sizes and/or shapes depending upon function. For example, size and shape may be selected depending upon function, capacity, or matching an area of a circuit block (also referred to as an intellectual property (IP) block, or functional block) within the chip.

Figure 8B:
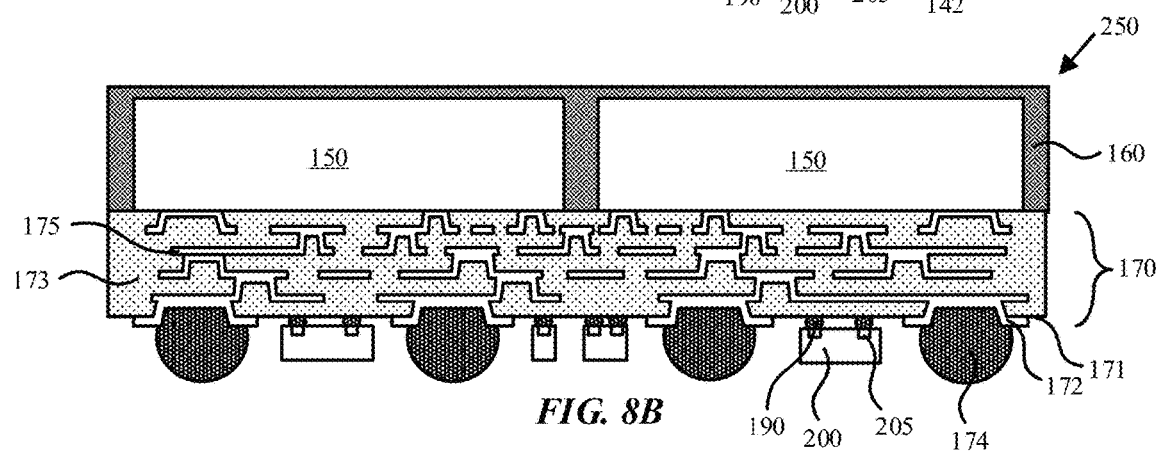
FIG. 8B is a schematic cross-sectional side view illustration of a package including a plurality of multi-component devices in accordance with an embodiment.

FIG. 8B is a schematic cross-sectional side view illustration of a package 250 including a plurality of multi-component devices 200 in accordance with an embodiment. In the exemplary embodiment illustrated, the package 250 can include one or more chips 150 encapsulated in a molding compound layer 160. A redistribution layer (RDL) 170 can then be formed over the active side faces of the chips 150 and the molding compound layer 160. The redistribution layer may include a plurality of dielectric layers 173 and electrical routing layers 175 (e.g. copper, aluminum, etc.) and a plurality of bond pads 172 on the underside 171 of the RDL 170. Similar to the chip 150 structure of FIG. 8A, one or more multi-component devices 200 can be mounted onto an underside 171 of the RDL 170 adjacent to the conductive bumps 174 (e.g. solder bumps).

Figure 9:
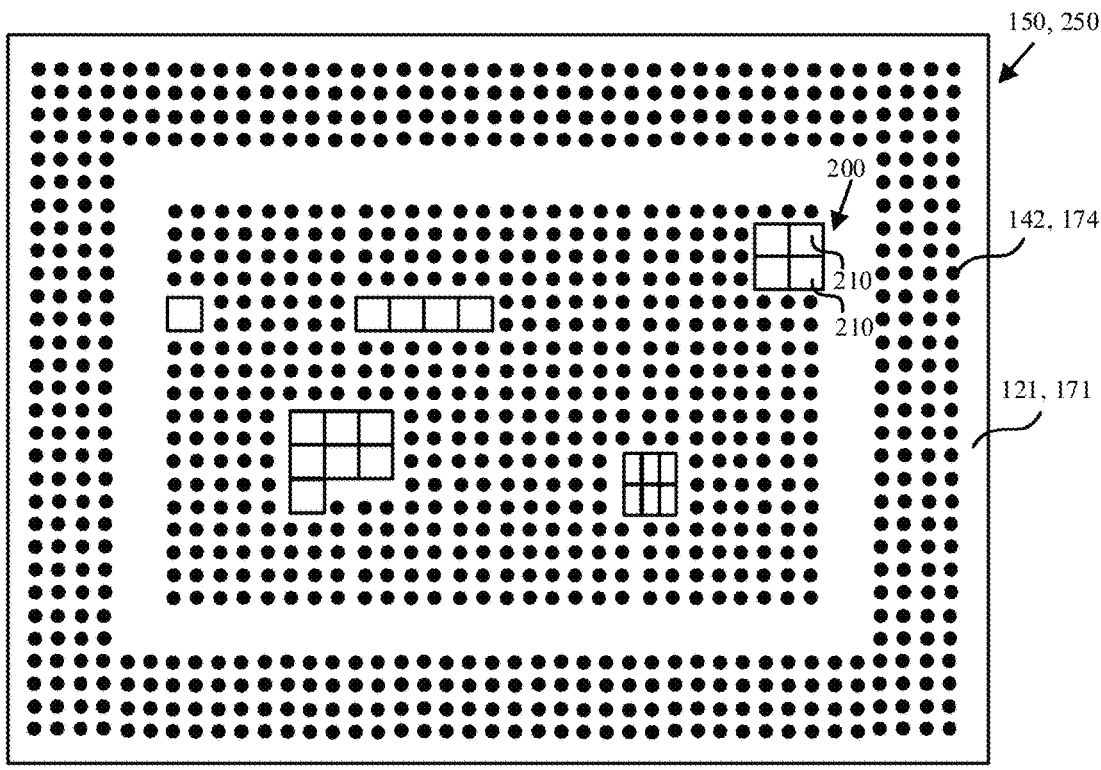
FIG. 9 is a schematic bottom view illustration of a plurality of multi-component devices mounted on an underside of a die or package in accordance with an embodiment.

FIG. 9 is a schematic bottom view illustration of a plurality of multi-component devices 200 mounted on an underside 121, 171 of a chip 150 or package 250 in accordance with an embodiment. As shown, the size or shape of each multi-component devices 200 can be different. Each multi-component devices 200 may additionally include a set of co-located components 210, which can be connected together or not.

In an embodiment, an electronic structure (e.g. chip, package) includes a routing layer (e.g. BEOL build-up structure 120 or RDL 170), and one or more dies on a top side of the routing layer. For example, the dies can be within one or more chips 150. A plurality of conductive bumps 142, 174 are on the underside of the routing layer, and a multi-component device 200 is bonded to the underside of the routing layer laterally adjacent to the plurality of conductive bumps. In accordance with embodiment, the multi-component device 200 includes a plurality of co-located components 210. Each component 210 may optionally be formed in the same substrate, such as the silicon wafer 102 for the FEOL die areas 110 previously described. In an embodiment, each component 210 of the plurality of co-located components includes separate (distinct) terminals. In an embodiment, the plurality of co-located components includes component-to-component routing 230. In an embodiment, the components 210 can be passive components, such as a capacitor, an inductor, or a resistor. The components 210 can be other devices, such as power management ICs.

Figure 10:
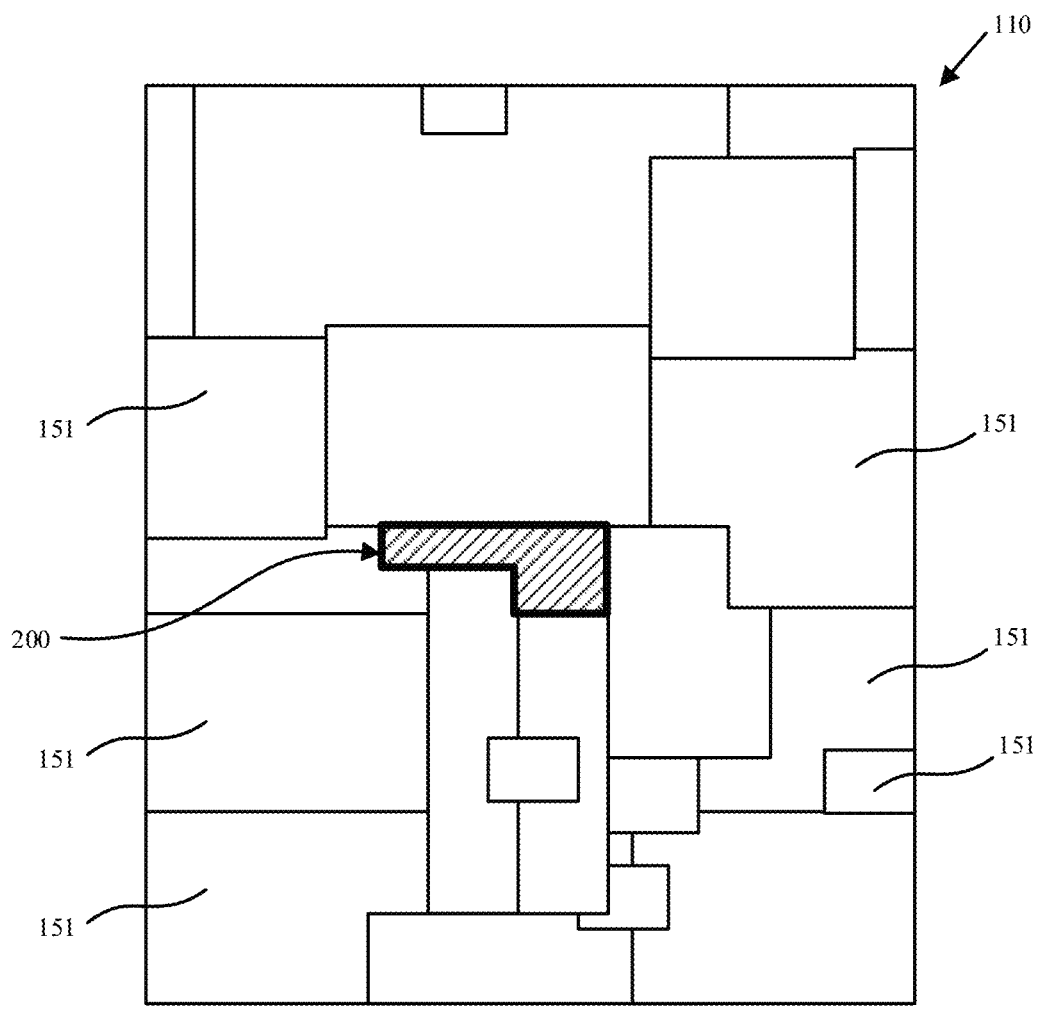
FIG. 10 is a schematic top view illustration an irregular shaped multi-component device mounted on an underside of a die or package in accordance with an embodiment.
Figure 11:
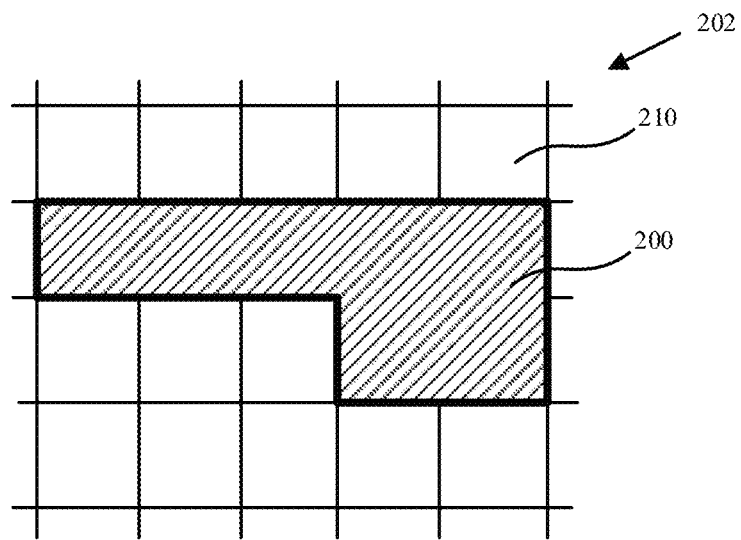
FIG. 11 is a schematic top view illustration of an irregular shaped multi-component device scribe area from a component wafer in accordance with an embodiment.

Referring now to FIG. 10, a schematic top view illustration is provided of an irregular shaped multi-component device 200 mounted on an underside of a die or package in accordance with an embodiment. As shown, the FEOL die area 110 of the die or a die within the package can include a plurality of circuit blocks 151 to perform different functions. In accordance with embodiments, the components 210 can be harvested to obtain a specific shape or size to accommodate, or fit within a specified circuit block 151 area, which can have an irregular shape (e.g. non-rectangular). In this manner, the multi-component device 200 does not have to overlap areas of adjacent circuit blocks. In an embodiment, the multi-component device 200 is bonded to the underside of the routing layer underneath a circuit block with an equivalent area as the non-rectangular area of the multi-component device 200. In a particular embodiment, the multi-component device 200 includes a plurality of power management ICs underneath a high power consuming circuit block, such as a CPU, GPU, etc. As such, when stitched together each additional component 210 may be used to provide an addition unit of current to the corresponding circuit block. Thus, an additional current source can be scaled by stitching together multiple components 210. In the exemplary embodiment illustrated, the circuit block and corresponding multi-component device 200 have an L-shape, though this is provided for illustrative purposes and the multi-component devices 200 in accordance with embodiments can assume a variety of irregular shapes. FIG. 11 is a schematic top view illustration for harvesting an irregular shaped multi-component device 200 from a component substrate (e.g. wafer) 202 in accordance with an embodiment.

Figure 12A:
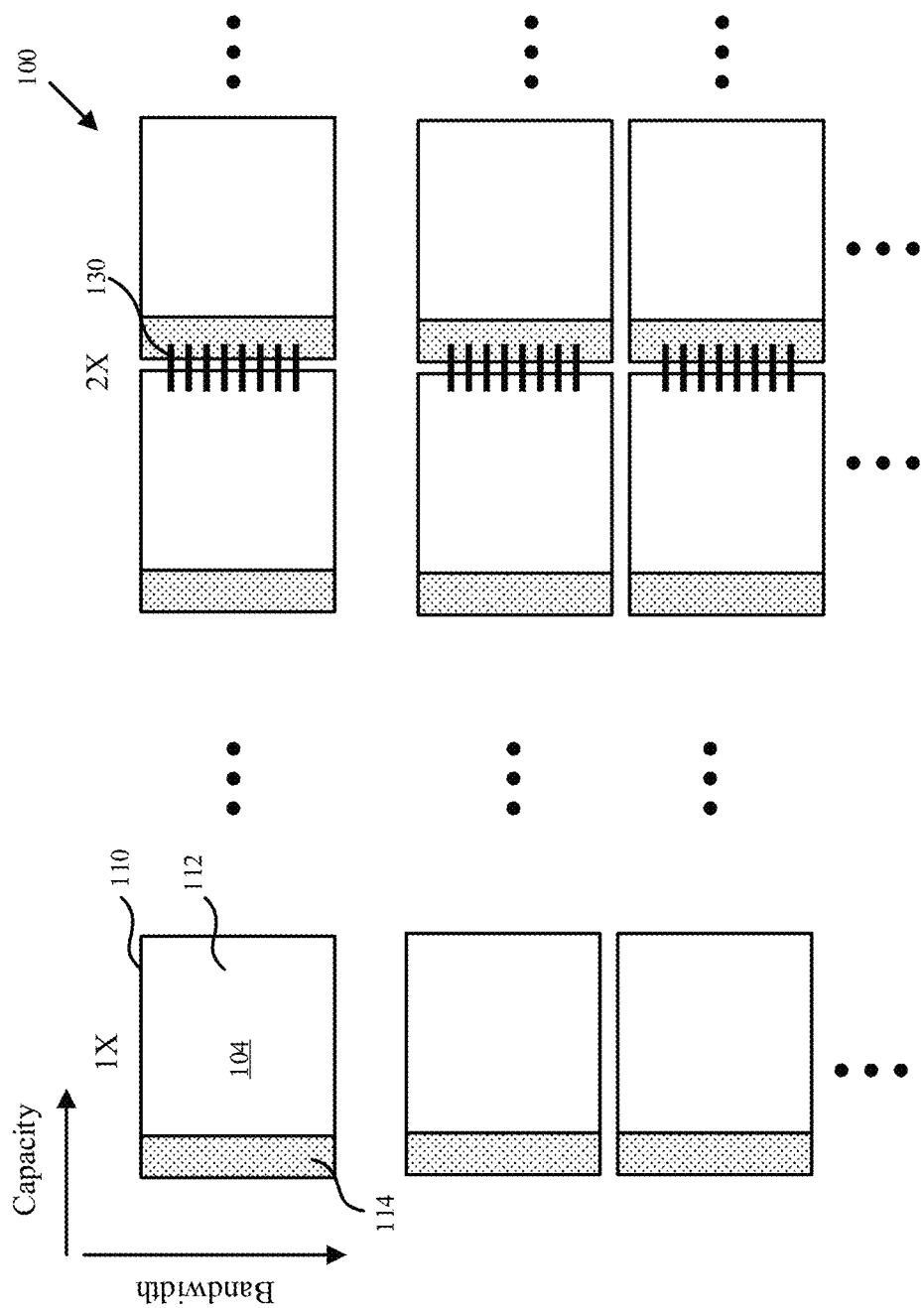
FIG. 12A is a schematic top view illustration multi-die set scaling with co-located dies and dies connected with die-to-die routing in accordance with an embodiment.

Referring again briefly to FIG. 7, the general principle of device scaling is applicable for all embodiments. FIG. 12A is a schematic top view illustration multi-die set scaling with co-located dies 104 and dies 104 connected with die-to-die routing 130 in accordance with an embodiment. By way of illustration the following description is made with regard to memory applications, though this is intended to be illustrative and embodiments are not limited to such. As shown, the harvesting techniques described can be utilized to harvest die sets 100 in order to expand capacity and/or bandwidth in the context of memory. This can be applicable to a variety of memory applications such as SRAM, MRAM, DRAM, NVRAM, NAND, cache memory, etc. As shown, each die 104 can include an FEOL die area that includes a device area 112 and input/output region(s) 114. Capacity may be increased by stitching together a series of dies 104 with die-to-die routing 130. Bandwidth may be increased by including additional rows of dies 104 within a die set 100. In this manner, specific die set 100 capacity and bandwidth can be harvested from a wafer 102 (or wafer stack) to meet product demand, and multiple products demands from the same source wafer 102.

While die-to-die routing 130 is illustrated only within rows of dies 104, it is understood that die-to-die routing 130 can also be included vertically between dies 104 in different rows, as originally illustrated in FIG. 1A for example. Furthermore, harvesting techniques described herein are not limited to particular arrangements with fixed row/column ratios of dies 104 or area. It is to be appreciated that the particular illustration in FIG. 12A shows input/output regions 114 on a single side of the dies 104. This may represent a general direction for the arrangement of external output logic. However, input/output regions 114 can be located at other die edges, and in particular where there is die-to-die routing 130. Thus, the simplified illustration in FIG. 12A, as well as other similar figures herein is understood to illustrate potential directionality of the stitched structures, and not the absence of input/output regions 114. In accordance with embodiments, the dies, die-to-die routing 130, partial metallic seals, and full metallic seals can be designed for flexibility in harvesting. For example, it is possible to harvest 1x die (with its own input/output region), to multiple dies. For example, in the embodiments illustrated in FIG. 12A this can include 2x dies (each with its own input/output region for external communication), or a single input/output region for external communication of the die set. In both situations, the 2x dies are internally connected. Similarly, FIG. 12A illustrates this extension to 4x dies that are internally connected. Various arrangements are possible for selecting which input/output regions are used for external communication with the connected die set.

Figure 12B:
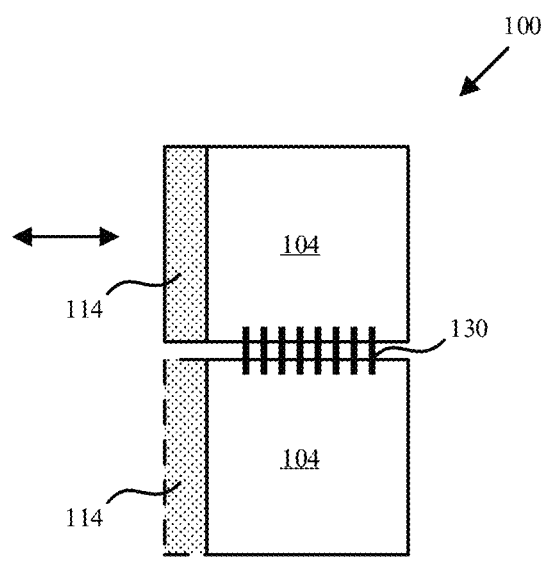
FIG. 12B is a schematic top view illustration multi-die set scaling with die-to-die routing in accordance with an embodiment.

FIG. 12B is a schematic top view illustration multi-die set scaling with die-to-die routing in accordance with an embodiment. In this embodiment, capacity can be increased by stitching together multiple dies 104 in the same column rather than row. In this case, the input/output region 114 can be turned off so that the lower die 104 is configured to communicate with an outside controller through the top die 104, for example. As such, a number of size and area arrangements are possible.

Figure 13A:
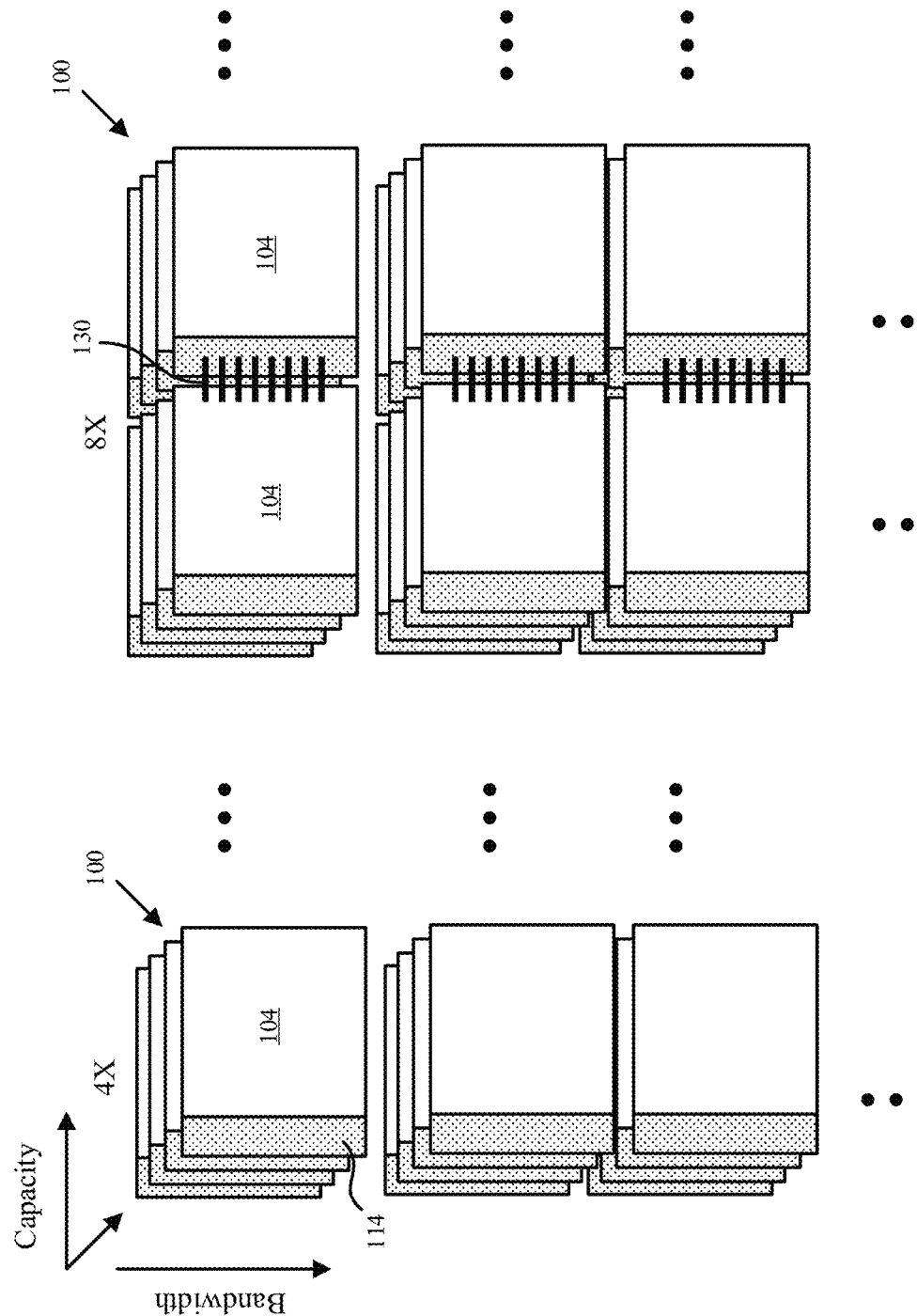
FIG. 13A is a schematic top view illustration multi-die set scaling with co-located dies, dies connected with die-to-die routing, and stacked dies in accordance with an embodiment.

Capacity can additionally be increased in accordance with embodiments by vertical stacking of dies 104. FIG. 13A is a schematic top view illustration multi-die set scaling with co-located dies, and dies connected with die-to-die routing, and stacked dies in accordance with an embodiment. FIG. 13A is substantially similar to that of FIG. 12A with the addition that of stacked dies 104 to increase capacity. Furthermore, various die-to-die routing 130 configurations are possible. For illustrative purposes, die-to-die routing 130 is shown between the top-most dies 104. In accordance with embodiments, die-to-die routing 130 can also be provided between adjacent dies 104 (row-wise and/or column-wise) within the same die level. In the exemplary embodiment illustrated, there are four die levels. Thus, dies 104 within each die level may be connected to one another with die-to-die routing 130. Dies 104 within different die levels can additionally be connected to one another in various manners depending upon the die stacking fabrication technique implemented, such as wafer-on-wafer (WoW) and chip-on-wafer (CoW). As previously described, the stacked die areas 110 and dies 104 may include distinct circuit blocks from one another. Each die area may represent a complete system, or sub-system. Adjacent die areas may perform the same or different function.

Figure 13B:
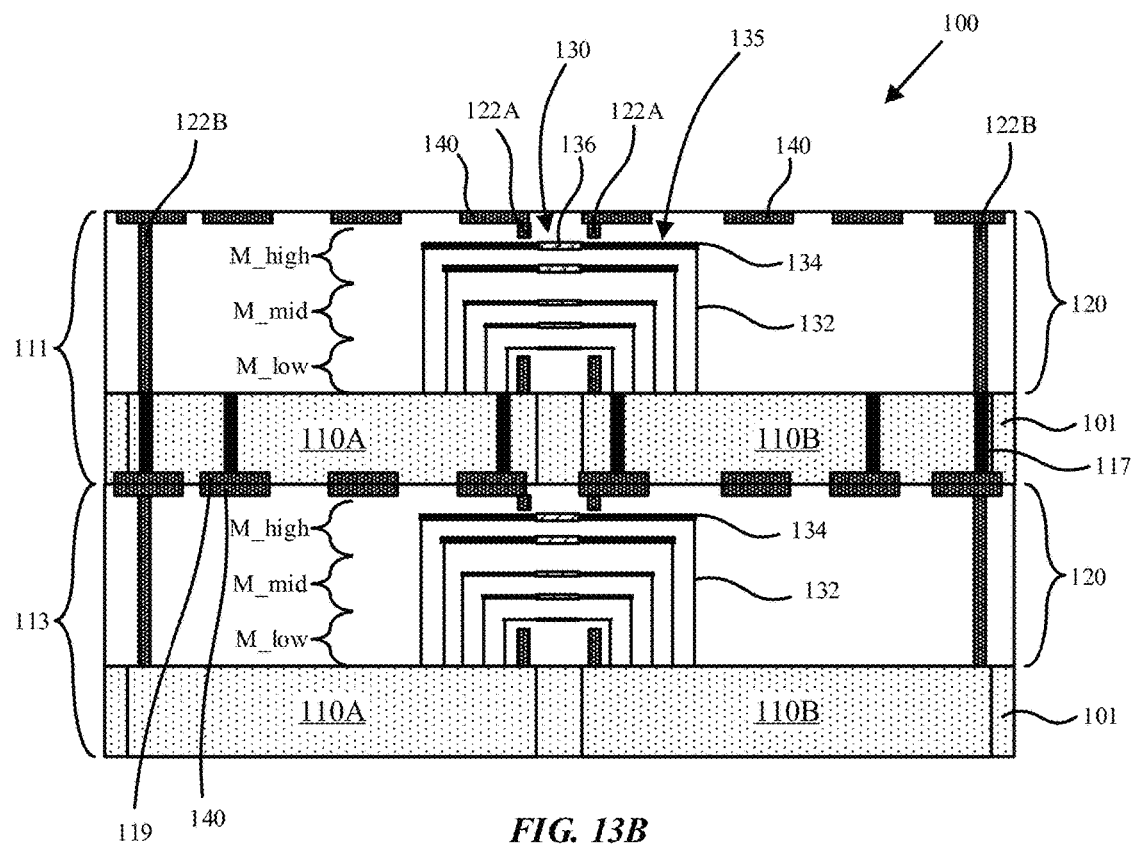
FIG. 13B is a schematic cross-sectional side view illustration of wafer-on-wafer stacked die sets in accordance with an embodiment.
Figure 13C:
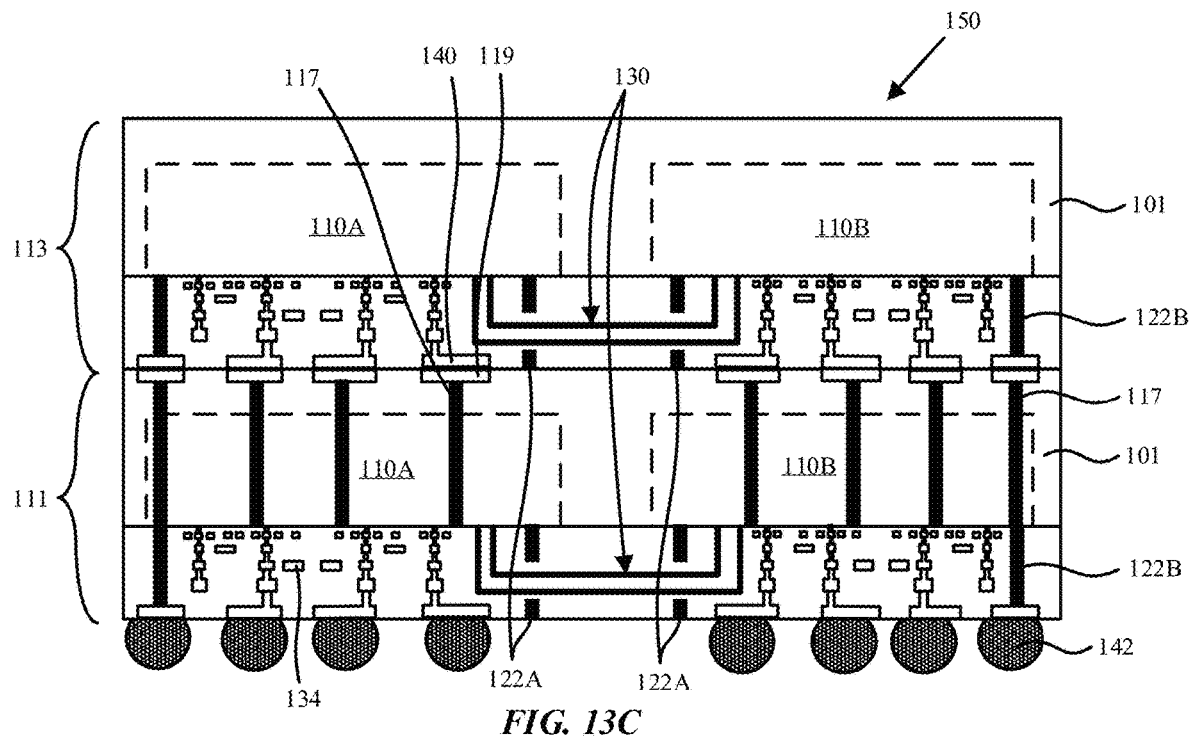
FIG. 13C is a schematic cross-sectional side view illustration of a chip including wafer-on-wafer stacked die sets in accordance with an embodiment.

FIG. 13B is a schematic cross-sectional side view illustration of WoW stacked die sets 100 in accordance with an embodiment. FIG. 13C is a schematic cross-sectional side view illustration of chip 150 including WoW stacked die sets in accordance with an embodiment. FIGS. 13B-13C are similar to that of FIGS. 3-4 with the addition of WoW stacked die sets. In such an embodiment, multiple wafers can be processed to include arrays of FEOL die areas 110 and BEOL build-up structures 120. The wafers can then be (e.g. hybrid) bonded front-to-back, face-to-face, or back-to-back. In the particular embodiment illustrated in FIG. 13B the wafers are bonded back-to-front with the semiconductor substrate 101 of a first wafer bonded the BEOL build-up structure 120 formed on the second wafer. Together the first semiconductor substrate 101 and first BEOL build-up structure 120 can form a first die level 111, and the second semiconductor substrate 101 and second BEOL build-up structure can form a second die level 113. This process can be repeated to provide additional die levels. Also, different combinations of front-to-back, face-to-face, or back-to-back are contemplated.

WoW bonding in accordance with embodiments may include hybrid bonding, which can include both oxide-oxide and metal-metal bond interfaces. Thus, an oxide layer on a back side of the first semiconductor substrate 101 can be bonded to an oxide layer in the second BEOL build-up structure 120. Additionally, metal contact pads 140 of the second BEOL build-up structure may be bonded to metal contact pads 119 on the back side of the first semiconductor substrate 101. Furthermore, the semiconductor substrates 101 may include through silicon vias 117, which can be connected to the contact pads 119, to accommodate vertical interconnection. Similar to previous descriptions, the WoW and CoW die stacks can be harvested in 1x, 2x, 4x, etc. stacked die sets with flexible selection of which input/output regions are used for external communication with the connected stacked die set.

Figure 13D:
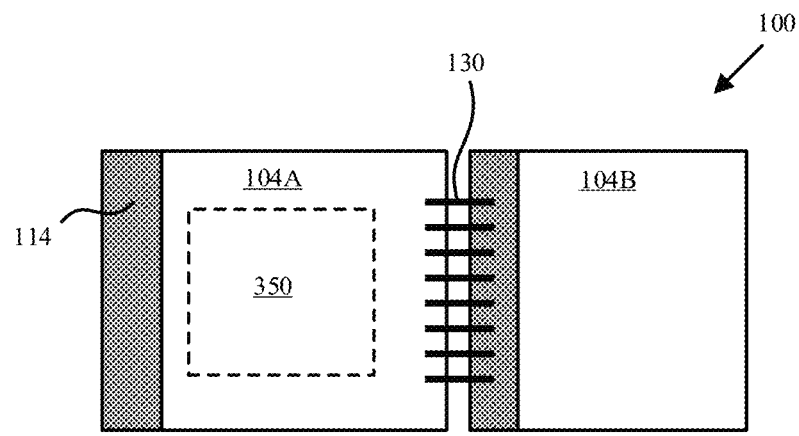
FIG. 13D is a schematic top view illustration of a chip-on-wafer stacked die set in accordance with an embodiment.

Referring now to FIG. 13D a schematic top view illustration is provided of a CoW stacked die set 100 in accordance with an embodiment. In the embodiment illustrated, one or more additional dies 350 can be bonded to one or more dies 104 in the stitched die set 100. Such a technique can also be used to partial die recovery. Also shown, the first level dies can include dies 104A and dies 104B, where dies 104B can be the same or different from dies 104A (e.g. perform different function), and dies 104A and 350 together can perform a useful function. As previously described the die areas and dies 104A, 104B, 350 may include distinct circuit blocks from one another. Each die area/die may represent a complete system, or sub-system. Adjacent and stacked die areas/dies may perform the same or different function.

Figure 13E:
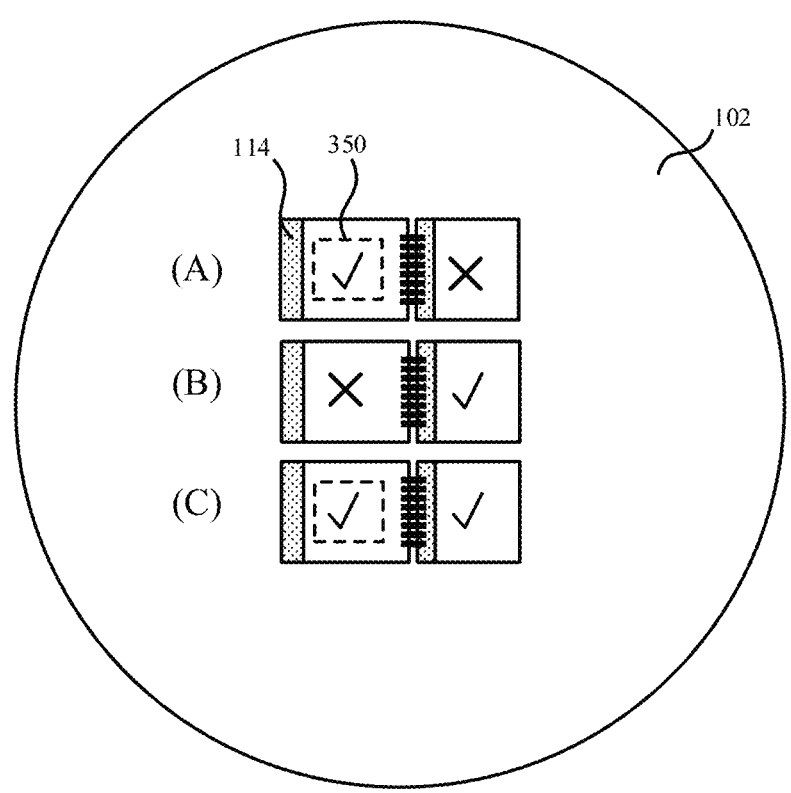
FIG. 13E is a schematic top view illustration of various possible outcomes for selecting stitched die sets onto which to mount chips-on-wafer in accordance with an embodiment.

By way of illustration, various possible outcomes are shown in FIG. 13E for stitched die 104 arrangements as previously described herein. For outcome (A) the left side die 104A is good, while the connected right side die 104B is determined to be bad after testing. This is reversed in outcome (B) where the left side die 104A is bad, while the connected right side die 104B is good. For outcome (C) it is determined both dies 104A, 104B are good. In this particular example it is presumed the input/output region 114 of the left side die 104A is going to be pre-selected to interface with a logic chip, for example consistent with the embodiment illustrated and described with regard to FIG. 14A. Thus, it may be necessary for the left side die 104A to be functional for operation of the die set 100. For outcome (A) the additional die 350 can be bonded to the left side die 104A. The combination of dies 104A and 350 can then be diced and harvested. This may avoid total loss of the die set 100. For outcome (B) however the die set 100 is not recoverable. For outcome (C) the additional die 350 can be used to increase capacity of the die set 100, for example. It is to be appreciated that while the exemplary embodiments are described with regard to two underlying stitched dies 104A, 104B and one additional top die 350, this is provided for illustrational purposes and embodiments are not so limited. Additionally, dies 104A, 104B may be a variety of types of dies, including XRAM, logic, etc.

Figure 13F:
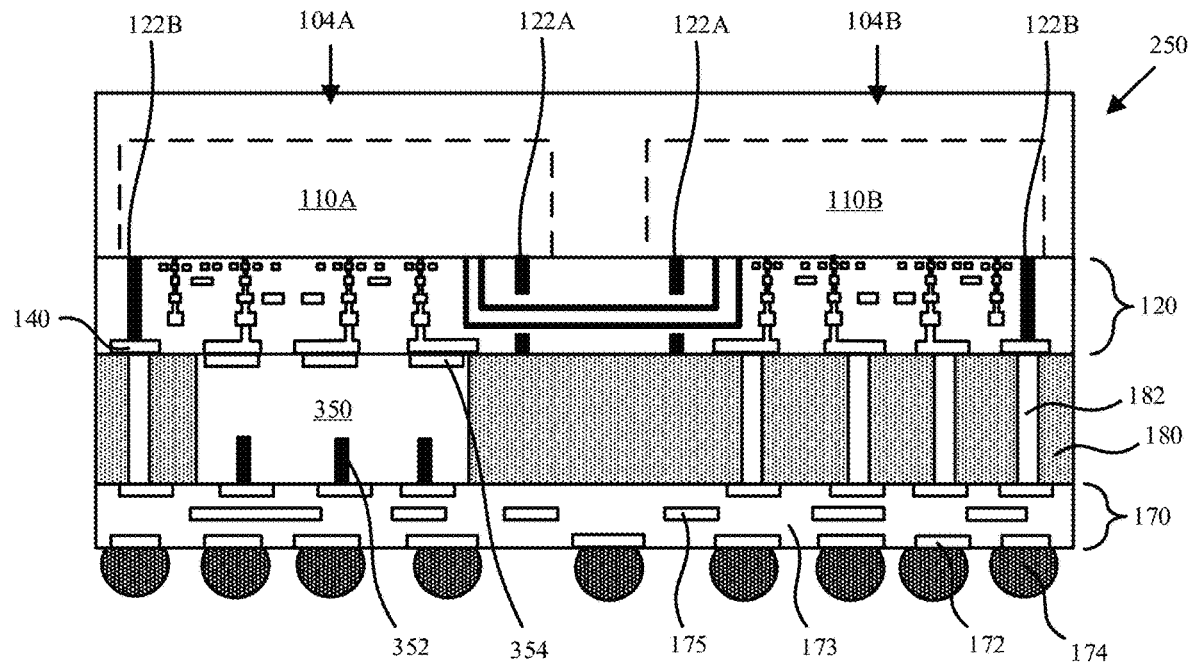
FIG. 13F is a schematic cross-sectional side view illustration of package including a chip-on-wafer stacked die set in accordance with an embodiment.

In accordance with embodiments the dies 350 can be mounted face down onto the wafers 102 including the stitched die sets 100. Further packaging solutions can then be employed. FIG. 13F is a schematic cross-sectional side view illustration of package 250 including a chip-on-wafer stacked die set 100 in accordance with an embodiment. In an embodiment, the dies 350 can be hybrid bonded to the BEOL build-up structure 120 spanning over the stitched dies 104A, 104B, which may include metal-metal bonds between contact pads 140 of the BEOL build-up structure 120 and contact pads 354 of die 350, and oxide-oxide bonds. In an embodiment, the die 350 can then be encapsulated in an encapsulation material 180 (e.g. inorganic dielectric such as oxide). This may be followed by the formation of through oxide vias to form vertical interconnections 182. Alternatively, conductive pillars can be formed, or printed circuit board (PCB) bars can be placed adjacent to the die 350 to for the vertical interconnections 182 prior to molding. A package RDL 170 can then be formed, for example as previously described with regard to FIG. 8B. In accordance with embodiments the die 350 may optionally include TSVs 352 for back side connection to the RDL 170.

Figure 13G:
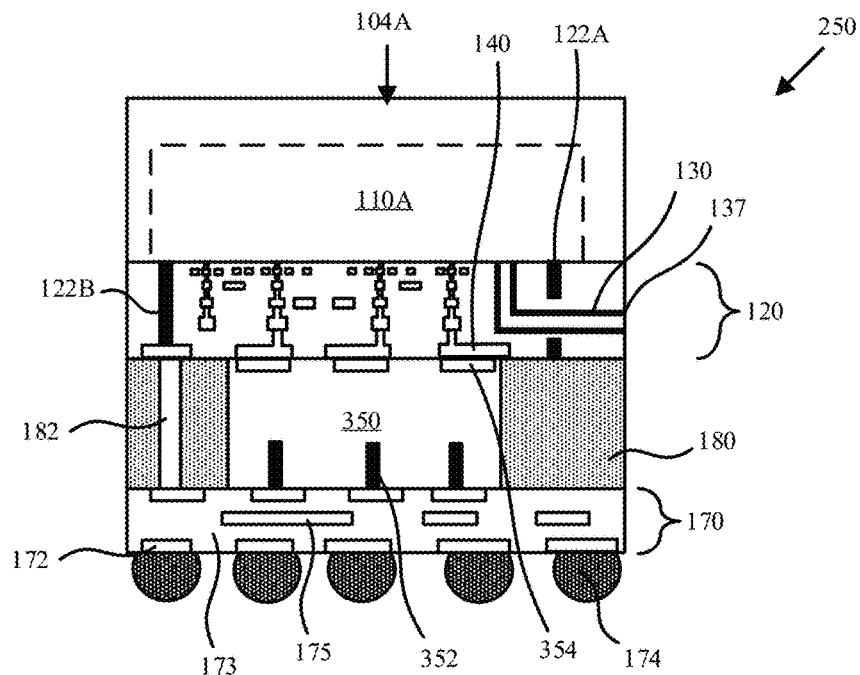
FIG. 13G is a schematic cross-sectional side view illustration of package including a chip-on-wafer stacked die set in accordance with an embodiment.

In some instances, the package 250 may be scribed to cut through die-to-die routing 130 as shown in FIG. 13G. For example, this could occur where the second die 104 is found to be a bad die, as previously described with regard to FIG. 13E outcome (A).

Up until this point various component and chip harvesting structures have been described in which various combinations of components or die sets can be obtained to meet specific applications. For example, die sets can be connected with die-to-die routing or stacking to form various engine combinations, logic expansion, capacity expansion, bandwidth expansion, and die recovery. Various specific applications will now be described. It is to be appreciated however, that while some of the following examples maybe described with regard to a specific application, such as memory expansion, it is to be appreciated that these are exemplary applications and embodiments are not so limited.

Figure 14A:
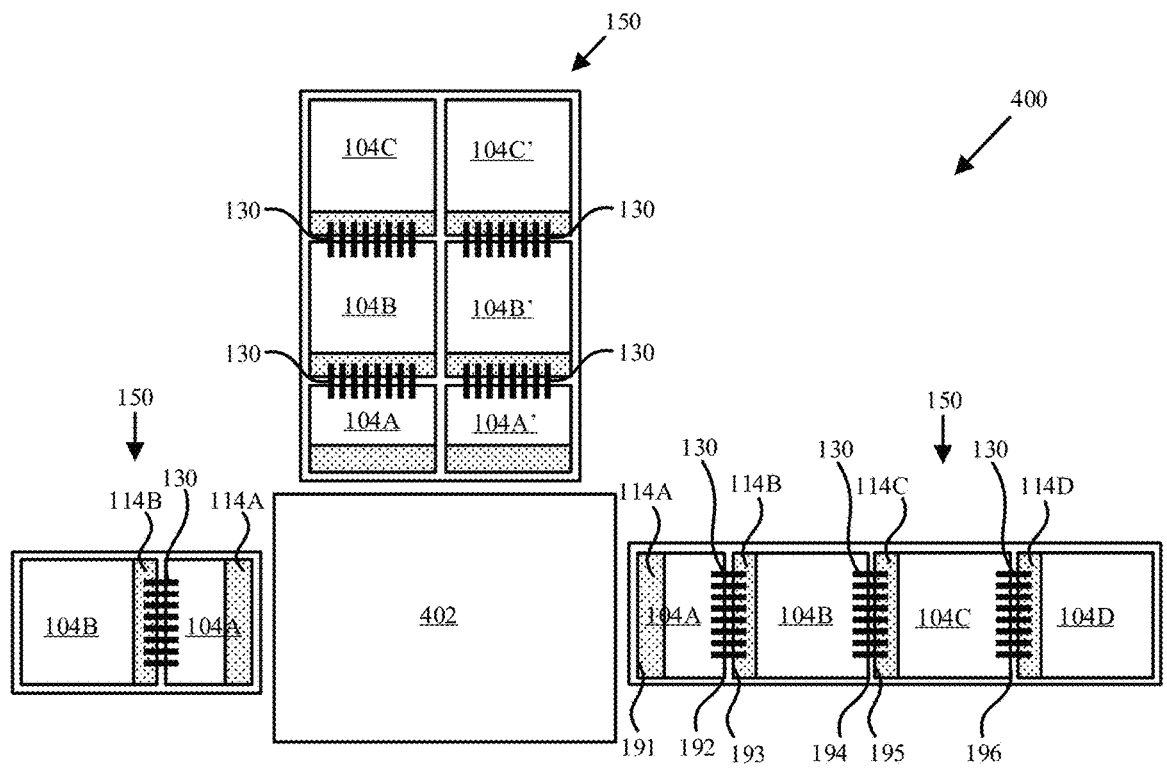
FIG. 14A is a schematic top view illustration of a memory system with various examples of memory bandwidth and capacity scaling in accordance with an embodiment.
Figure 14B:
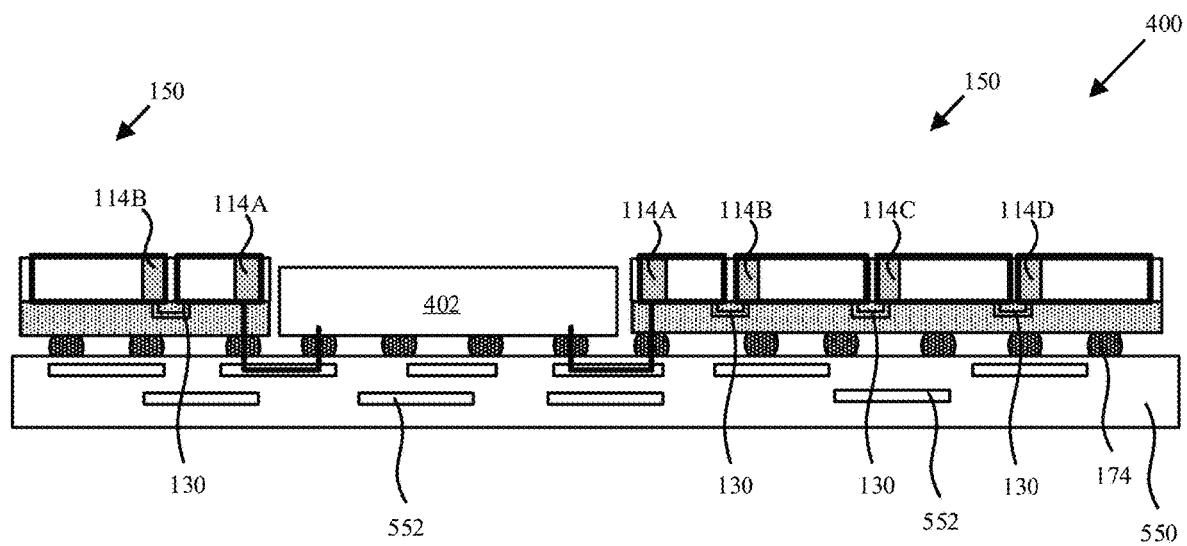
FIG. 14B is a schematic cross-sectional side view illustration of the memory system of FIG. 14A in accordance with an embodiment.

Referring now to FIG. 14A is a schematic top view illustration of a memory system 400 with various examples of memory bandwidth and capacity scaling in accordance with an embodiment. FIG. 14B is a schematic cross-sectional side view illustration of the memory system 400 of FIG. 14A in accordance with an embodiment. As shown, the memory system 400 can include one or more chips 150 (or packages) arranged around a logic chip 402 (or package). Each chip 150 can include one or more dies 104 stitched together with die-to-die routing 130. Each of the dies 104 within a chip 150 can be the same type of die, or different types. For example, the die 104 closest to the logic chip 402 can be configured to handle communications with the logic chip 402. For example, this first die 104 may be memory cache or controller memory die, which can include a buffer for partitioning signals for communication with additional dies 104 further down the chain win the chip 150. As previously described the stacked die areas 110 and dies 104 may include distinct circuit blocks from one another. Each die area may represent a complete system, or sub-system. Adjacent die areas may perform the same or different function.

In the exemplary implementation illustrated in FIG. 14B, the chips 150 and logic chip 402 can be mounted on a wiring substrate 550 including electrical routing lines 552 with conductive bumps 174 (e.g. solder). As shown, the input/output region 114 of the chips 150 adjacent to the logic chip 402 can function as external input/output to communicate with the logic chip 402 via the wiring substrate 550. It is to be appreciated that other packaging solutions are possible, and embodiments are not so limited.

Referring now to FIG. 14A in combination with FIG. 3, in an embodiment a multi-die structure includes a chip 150 including a first front-end-of-the line (FEOL) die area 110A of a first die 104A (e.g. closest to the main logic chip 402 including a controller function) patterned into a semiconductor substrate 101 and a second FEOL die area 110B of a second die 104B patterned into the semiconductor substrate 101, the second FEOL die area 110B separate from the first FEOL die area 110C. The first FEOL die area 110A may include a first-first side 191 and a first-second side 192 opposite the first-first side, and a first input/output region 114A adjacent to the first-first side 191, and the second FEOL die area 110B includes a second-first side 193 and a second-second side 194 opposite the second-first side, and a second input/output region adjacent to the second-first side 193, with the first-second side 192 of the first FEOL die area 110A adjacent to the second-first side 193 of the second FEOL die area 110B. A back-end-of-the-line (BEOL) build-up structure 120 spans over the first FEOL die area 110A and the second FEOL die area 110B as shown in FIG. 3, with the BEOL build-up structure 120 including a die-to-die routing 130 connecting the second input/output region 114B and the first FEOL die are 110A (for example to a corresponding input/output region of the first FEOL die area 110A).

Additional dies can be stitched together for additional memory expansion. For example, a third FEOL die area of a third die 104C can also be patterned into the semiconductor substrate 101, with the third FEOL die area separate from the first FEOL die area 110A and the second FEOL die area 110B. Similarly, the third FEOL die area can include a third-first side 195 and a third-second side 196 opposite the third-first side 195, and a third input/output region 114C adjacent to the third-first side 195, where the second-second side 194 of the second FEOL die area 110B is adjacent to the third-first side 195 of the second FEOL die area. Similarly, the BEOL build-up structure 120 spans over the third FEOL die area, and includes a second die-to-die routing 130 connecting the third input/output region 114C and the second FEOL die area 110B (for example to a corresponding input/output region of the first FEOL die area 110A). As shown, a fourth die 104D with a fourth input/output region 114D can additionally be tied to the third die 104C, and so forth.

It is to be appreciated that an actual memory system would likely have more balanced memory, and that the illustration of different sized chips 150 is for illustrational purposes only to show the potential for memory scaling with harvested die sets.

Additional strings of stitched dies can also be located adjacent to one another, for example, for bandwidth expansion. Referring now to the top chip 150 of FIG. 14A including six dies 104, including a first die 104A', second die 104B', and third die 104C' etc. arranged similarly, and side-by-side with the first, second and third dies 104A, 104B, 104C as previously described, with the input/output regions aligned and located adjacent to and electrically connected with the logic chip 402.

In accordance with embodiments, the dies of memory system 400 can be any of, or combination of, cache memory, NAND, SRAM, MRAM, NVRAM, DRAM, or other "X"RAM.

In a particular embodiment, the first dies with external input/output regions 114 are memory cache dies, and the following dies are other types of memory dies (e.g. XRAM). In an embodiment, the first die 104A includes an input/output (e.g. data) buffer that is not included in the following stitched dies (104B, 104C, 104D, etc.). As such, the chips 150 can function somewhat similar as a quad die package (QDP) load-reduction arrangement that uses a data buffer chip to reduce and minimize the load on the server memory bus, though dies 104 can be serially connected in the embodiment. Alternatively, where the dies are the same type of dies, similar input/output buffers can be included in the dies, though not operated, with the internal links providing communication between dies.

In an embodiment, the dies 104A, 104A' can be controller memory dies configured to communicate with the logic chip 402 and the following stitched dies (104B, 104C, 104D, 104B', 104C', 104D', etc.) are service memory dies configured to communicate with the logic chip through the controller memory die. As such, the chips 150 can function somewhat similar as a 3D stacked registered memory modules.

Similar to previous descriptions, the chips 150 can include partial metallic seals 122A along the die edges where die-to-die routing 130 is present. For example, a first partial metallic seal 122A can be located adjacent to the first-second side 192 of the first FEOL die area 110A, and a second partial metallic seal 122A can be located adjacent to the second-first side 193 of the second FEOL die area 110B, where die-to-die routing 130 extends through first openings in the first partial metallic seal and second openings in the second partial metallic seal. Such an arrangement may be provided for all die-to-die routings 130.

The memory systems 400 in accordance with embodiments can also include stacked die sets which an additionally be combined with the stitched die sets. In this manner, stitching can occur between any or all die levels in the stacked die sets. Furthermore, the stacked die sets can include CoW or WoW die stacking as previously described with regard to FIGS. 13A-13G.

In an embodiment, WoW die stacking may be utilized to form a multi-die structure in the memory system 400 in which the semiconductor substrate, the first FEOL die area, second FEOL die area, and BEOL build-up structure form a first die level 111, and a second die level 113 hybrid bonded to the first die level 111. The second die level 113 may include a third front-end-of-the line (FEOL) die area of a third die patterned into a second semiconductor substrate and a fourth FEOL die area of a fourth die patterned into the second semiconductor substrate, with the fourth FEOL die area separate from the third FEOL die area similarly as the first die level. For example, the first and second die levels can include stacked memory dies as shown in FIG. 13A.

In an embodiment CoW die stacking may be utilized to form a multi-die structure in the memory system 400 in which second chips are hybrid bonded face-to-face with the BEOL build-up structure, and an encapsulation material laterally (e.g. inorganic dielectric) surrounds the second chips on the BEOL build-up structure as illustrated in FIGS. 13F-13G. For example, the second chips can be an additional memory die as shown in FIG. 13A. Front-to-back or back-to-back hybrid bonding can also be performed rather than face-to-face hybrid bonding.

Figure 15A:
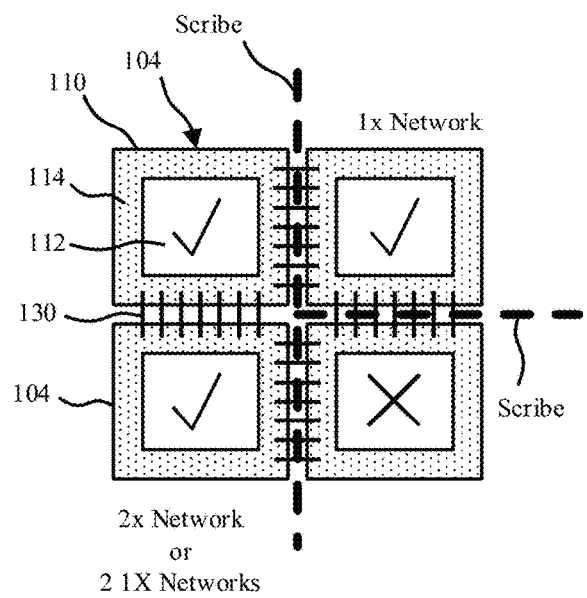
FIGS. 15A-15B are close-up schematic top view illustrations of harvesting network dies from a wafer in accordance with embodiments.
Figure 15B:
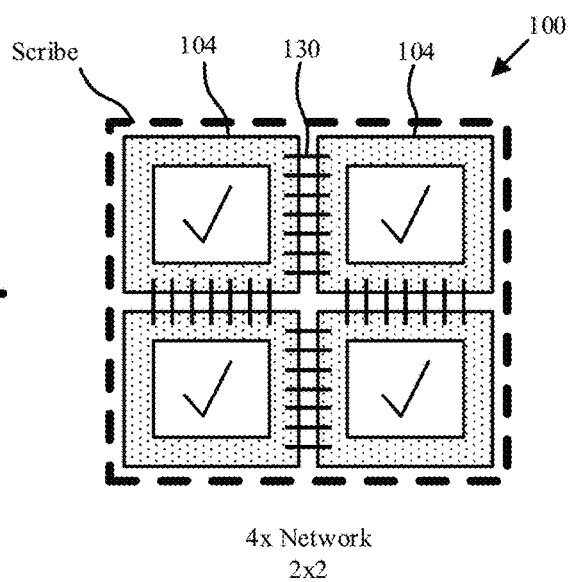

In yet an additional illustrative implementation the die harvesting techniques can be used for scalable network systems. Referring now to FIGS. 15A-15B close-up schematic top view illustrations of harvesting network dies from a wafer in accordance with embodiments. Similar to previously described embodiments, the network dies 104 can include a die area 110 including a device area 112 and input/output region(s) 114, which can be arranged around any edges or corners for connection with adjacent dies 104. In the particular embodiment illustrated in FIG. 15A, a 1× network single die set and 2× network multi-die set, or two 1× network dies can be scribed out from a 2×2 array of dies where there is a bad die. FIG. 15B illustrates a 4× network die set 100. Similar to previous embodiments, partial metallic seals can be formed along the die 104 edges where die-to-die routing 130 is present. Additionally, the die sets may include multiple die levels, as with CoW or WoW descriptions. As previously described the stacked die areas 110 and dies 104 may include distinct circuit blocks from one another. Each die area may represent a complete system, or sub-system. Adjacent die areas may perform the same or different function.

Figure 15C:
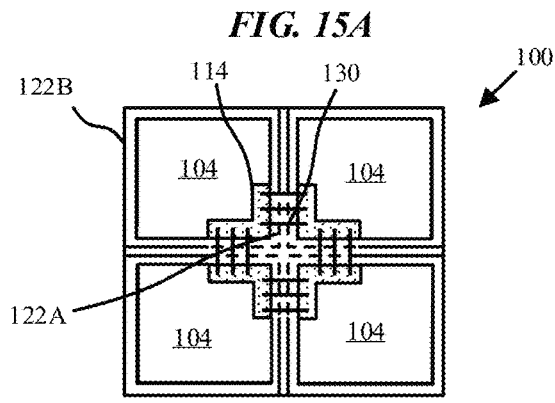
FIG. 15C is a close-up schematic top view illustration of a network die area set in accordance with an embodiment.

FIG. 15C is a close-up schematic top view illustration of a network die set 100 in accordance with an embodiment. The die set 100 of FIG. 15C differs from that of FIG. 15B in location of the input/output regions 114, which are located in a center area of the die set 100, which may reduce power and latency. Also shown in FIG. 15C are full metallic seals 122B and partial metallic seals 122A adjacent to the input/output regions 114 where die-to-die routing 130 is located. At the wafer level the illustrated network die set 100 can be a repeating pattern across the wafer. Where bad dies 104 occur, harvesting can occur similarly as described with other embodiments described herein.

Figure 15D:
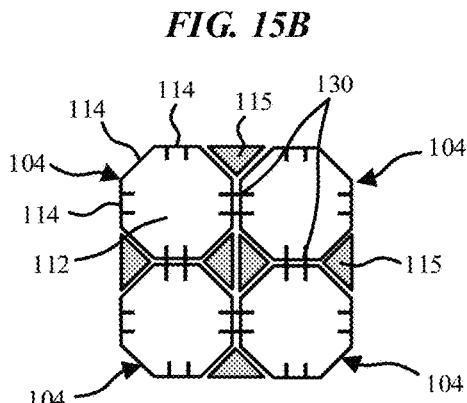
FIG. 15D is a close-up schematic top view illustration of an array of network dies on a wafer in accordance with an embodiment.

Referring now to FIG. 15D a close-up schematic top view illustration is provided of an array of network dies 104 on a wafer in accordance with an embodiment. The arrangement of FIG. 15D is substantially similar to that illustrated in FIG. 15A, with a difference being the device areas 112 may correspond to essential network functions, and additional optional network or other functions can be located in secondary areas 115. In this instance, the input/output regions 114 are located along edges of the device areas 112, where the dies 104 may be connected with die-to-die routing 130 running through partial metallic seals.

Figure 15E:
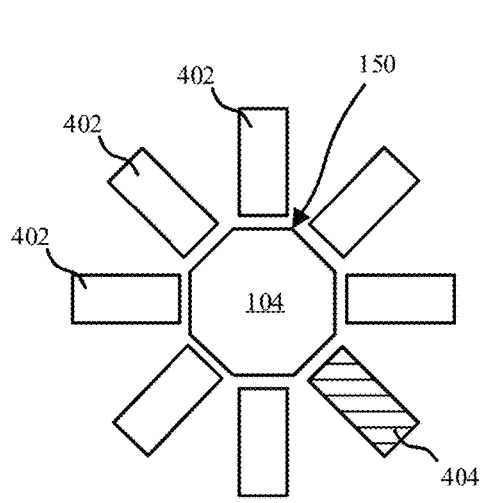
FIG. 15E is an illustration of a module including a plurality of logic chips arranged around a harvested single die set network chip in accordance with an embodiment.
Figure 15F:
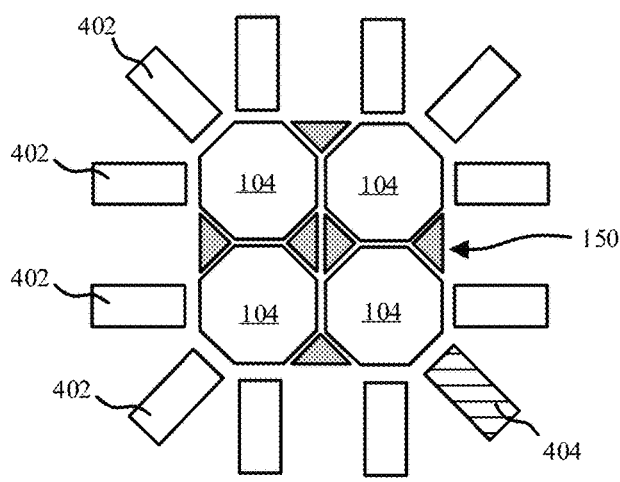
FIG. 15F is an illustration of a module including a plurality of logic chips arranged around a harvested multi-die set network chip in accordance with an embodiment.

FIG. 15E is an illustration of a module including a plurality of logic chips 402 arranged around a harvested single die set network chip 150 in accordance with an embodiment. FIG. 15F is an illustration of a module including a plurality of logic chips 402 arranged around a harvested multi-die set network chip 402 in accordance with an embodiment. In the illustrated embodiments, the dies 104 of FIG. 15D can be harvested into an appropriately sized die set to provide scaled networking resources. The network chips 150 (or packages) can support logic chips 402 as illustrated (e.g. SOC), or can also be used to support other functions (other logic, XRAM, etc.) and may be arranged in 3D (e.g. CoW or WOW as previously described). Additional chips 404 can also be connected to support alternative functions. Thus, not all dies or chips connected to the network chip 402 need be the same type. It is to be appreciated that the embodiments illustrated in FIGS. 15A-15F show rectangular, or octagon network elements that this is illustrative, and embodiments may also employ other non-rectangular shapes such as triangle, hexagon, round, etc. as may be useful for other systems.

Figure 15G:
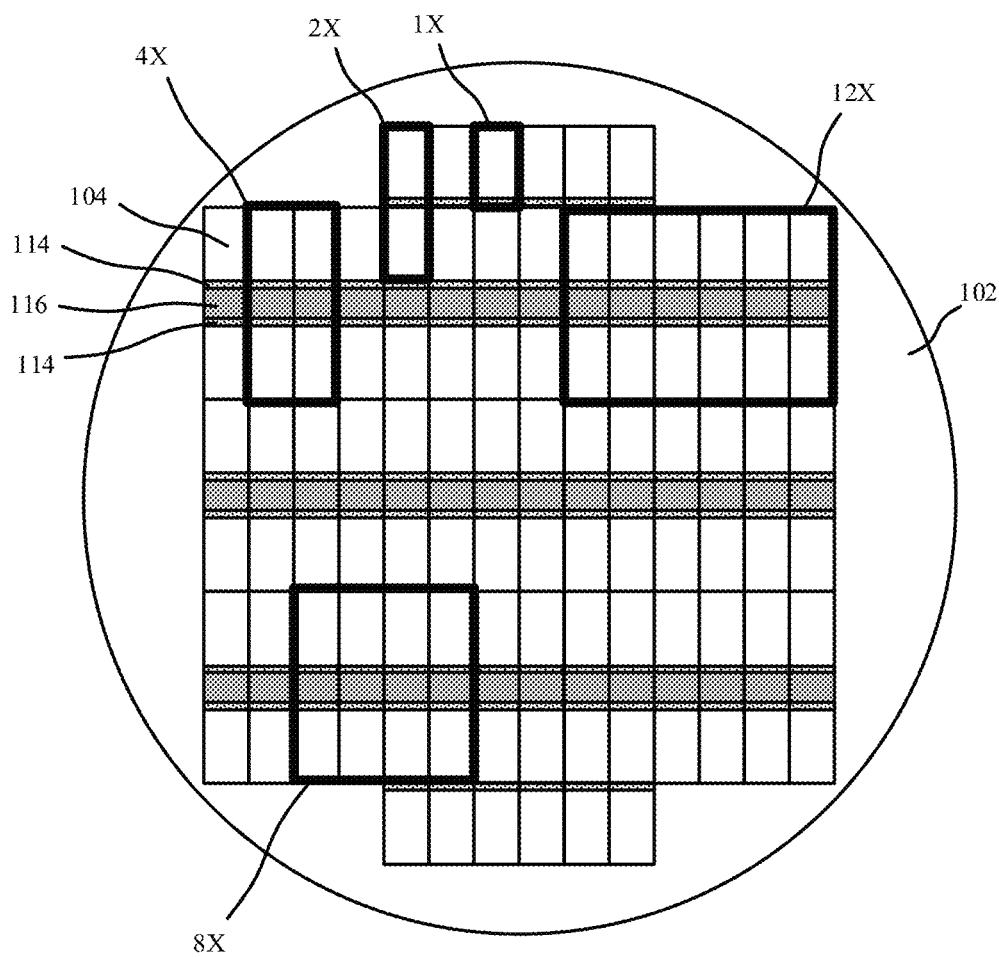
FIG. 15G is schematic top view layout plan illustration of harvesting network dies from wafer in accordance with an embodiment.
Figure 15H:
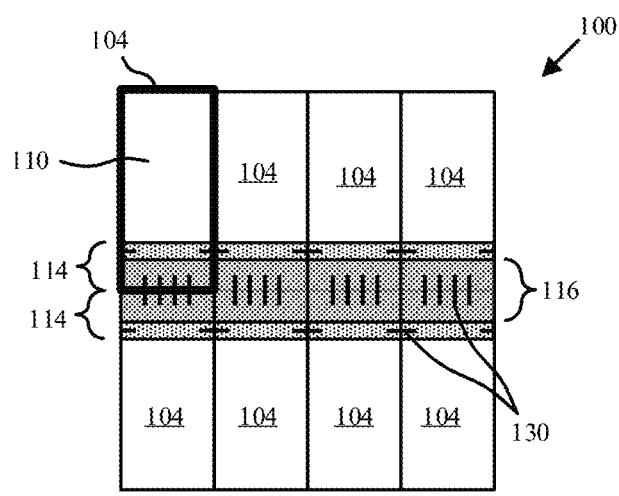
FIG. 15H is a schematic top view illustration of a die set including multiple network dies in accordance with an embodiment.

An alternative arrangement of network die harvesting is illustrated in FIGS. 15G-15H. FIG. 15G is schematic top view layout plan illustration of harvesting network dies 104 from wafer 102 in accordance with an embodiment. FIG. 15H is a schematic top view illustration of a die set 100 including multiple network dies 104 in accordance with an embodiment. Such an implementation is similar to previous embodiments of FIGS. 15A-15F, with a difference being that a network region 116 spans across the input/output regions 114 on a single side of the dies 104. In this case various die sets 1×, 2×, 4×, 8×, 12×, etc. can be harvested depending upon end application and wafer 102 yield. In this case the dies 104 on opposite sides of the network region 116 can be the same or different die types (perform different functions). Network regions 116 in accordance with embodiments may include circuits that enable propagation of data from one chip to the other. Such networks may be circuit switched, or packet switched networks, and may include cross-bar functionalities. The connectivity may be linear, two dimensional, or other topologies. In addition, the network region may include cache elements, or other logic functions. Harvesting may include dicing the number of units required, or even having more units than required and accepting one or more units that fail. For example, a harvested die set 100 including 12× dies may include twelve good dies, or ten good dies and two bad dies. Additionally, redundancy can be added by including one or more extra units (dies), or complete subsystems. In event of a unit failure, a good unit can be swapped. Redundancy can be at the time of manufacture, or swappable in the field. In the illustrated embodiment, the network region 116 is much more bus-like, or similar to an interfacing bar as will be described next, while still being integrated on-chip.

Figure 16A:
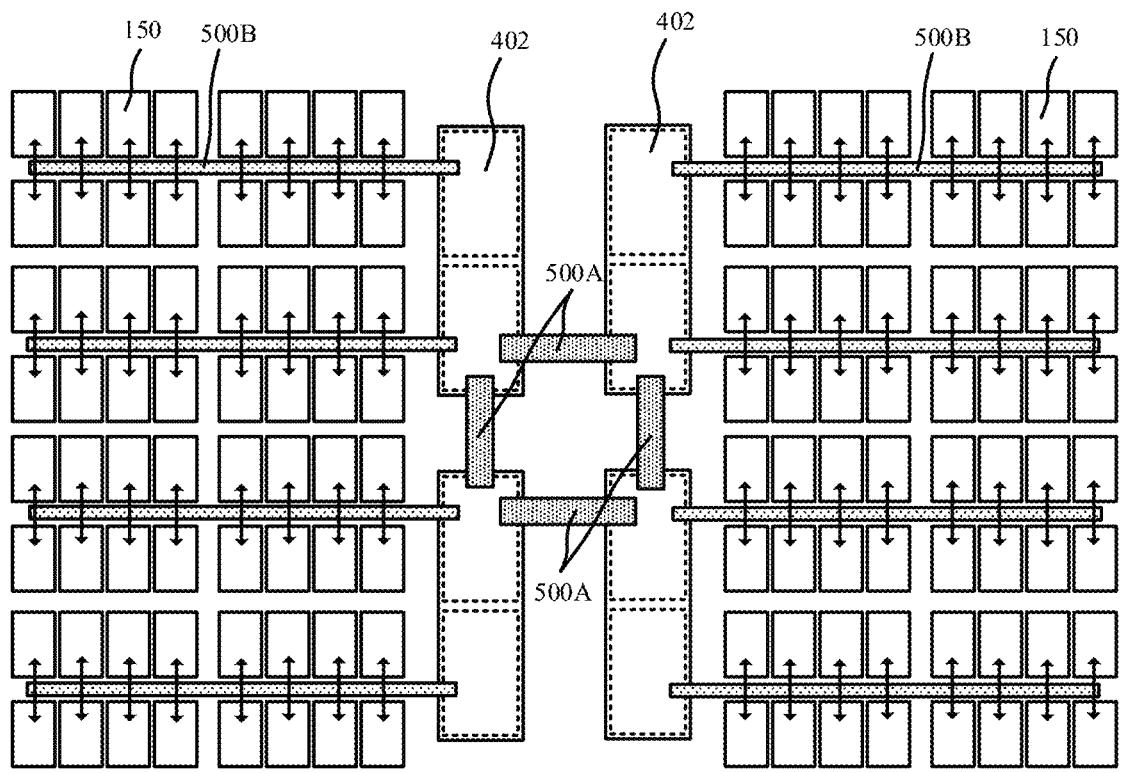
FIG. 16A is a schematic top view illustration of both logic and memory scaling with stitched interfacing bars in accordance with an embodiment.

The stitching and harvesting techniques in accordance with embodiments may be utilized to form a variety of arrayed structures. FIG. 16A is a schematic top view illustration of both logic and memory scaling with stitched interfacing bars 500 in accordance with an embodiment. As shown, interfacing bars 500A can function as communication bars to provide modularity to a variety of combinations of logic chips 402 including CPU, GPU, networks, caches, signal processors, glue logic, etc. and system on chip. The interfacing bars 500A in accordance with embodiments can be used to provide high bandwidth, low power, scalable connectivity between two or more chips. Use of communication bars allows flexibility for location of input/output (I/O) terminals on the logic die, which do not have to be at the die/chip edges. Furthermore, there is flexibility of start and endpoint location. In some embodiments, the interfacing bars 500A may include an active piece of silicon, and can provide flexibility and ease of design to the logic chips 402. Groups of chips 150 (such as memory chips) can additionally be coupled with the logic chips 402 with interfacing bars 500B (e.g. memory bars), which may optionally be placed in series to increase memory density. Thus, in accordance with embodiments, the connectivity organization, and even bandwidth and latency, can be tailored. Furthermore, the logic chips 402 do not need to be pre-committed to providing maximum bandwidth and routing resources. The arrangement in FIG. 16A can be adjusted to provide memory capacity and/or short logic connectivity.

Figure 16B:
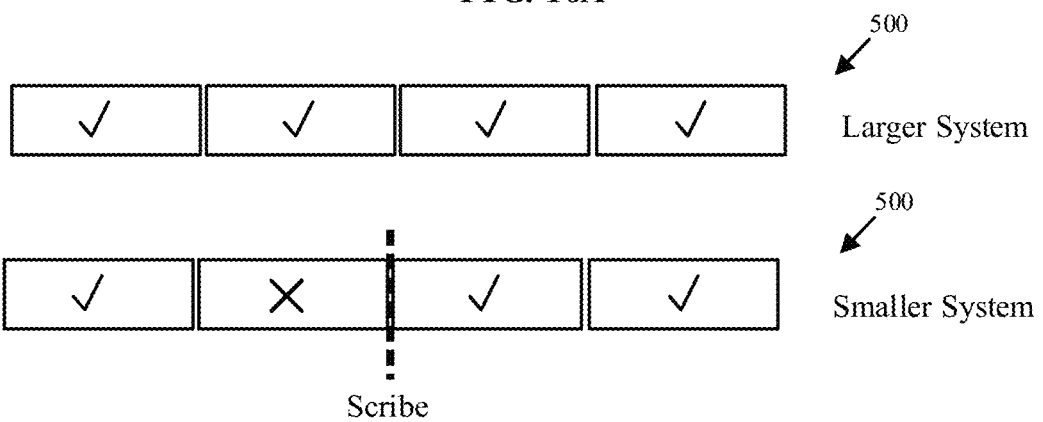
FIG. 16B is a schematic top view illustration of scribed interfacing bars in accordance with an embodiment.
Figure 16C:
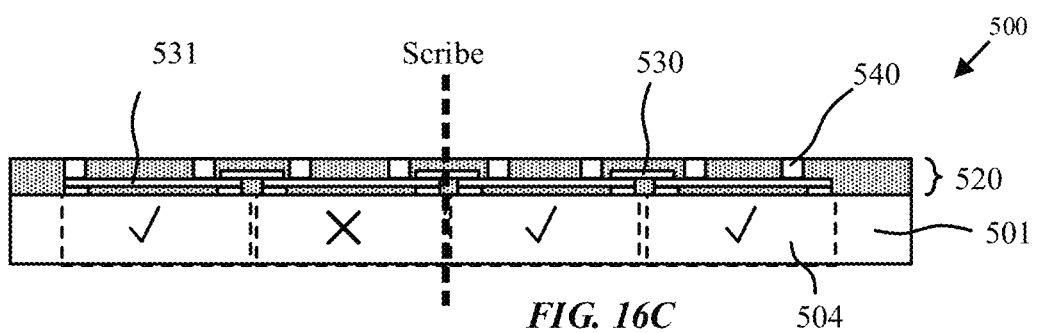
FIG. 16C is a schematic cross-sectional side view illustration of stitched interfacing bars in accordance with an embodiment.

The interfacing bars 500 in accordance with embodiments can be harvested similarly as the dies and components described herein. For example, as shown in FIG. 16B specific sections 504 with bar-to-bar routing 530 can be scribed to obtain larger or smaller systems. Likewise, any bad sections 504 can be removed. FIG. 16C is a schematic cross-sectional side view illustration of stitched interfacing bars 500 in accordance with an embodiment. As shown, sections 504 can be provisioned in a substrate 501, such as silicon substrate. Substrate 501 may include active silicon (or other material) to include features such as logic, repeaters, flops, cache, memory compressors and decompressors, controllers, local processing elements, etc. Other non-silicon technologies such as, but not limited to, GaAs may also be used for substrate 501 if appropriate, or even optical interconnect technologies, many of which are supported by silicon. The routing layer 520 may include one or more metal and dielectric layers. Routing layer 520 may be formed using thin film technology, or traditional BEOL processing techniques, such as damascene, etc. Routing layer 520 may include wiring layers such as lower wiring layer, middle wiring layers, and upper wiring layers. The wiring layers may optionally have different thicknesses, with M_high being the thickest, and M_low being the thinnest. In some embodiments, the quality of service can be used to organize metal usage based on requirements such as latency, power, etc. In an embodiment, high priority traffic with low latency requirements can be on the higher (thicker) layers, while bulk traffic more latency latitude, may be in the lower (thinner) layers. Wiring layers 531 may run a substantial length of the sections 504 for interconnectivity, while bar-to-bar routing 530 is used to connect adjacent sections 504. The routing layer 520 may terminate with contact pads 540, which can be further connected with various packaging sequences.

Figure 17A:
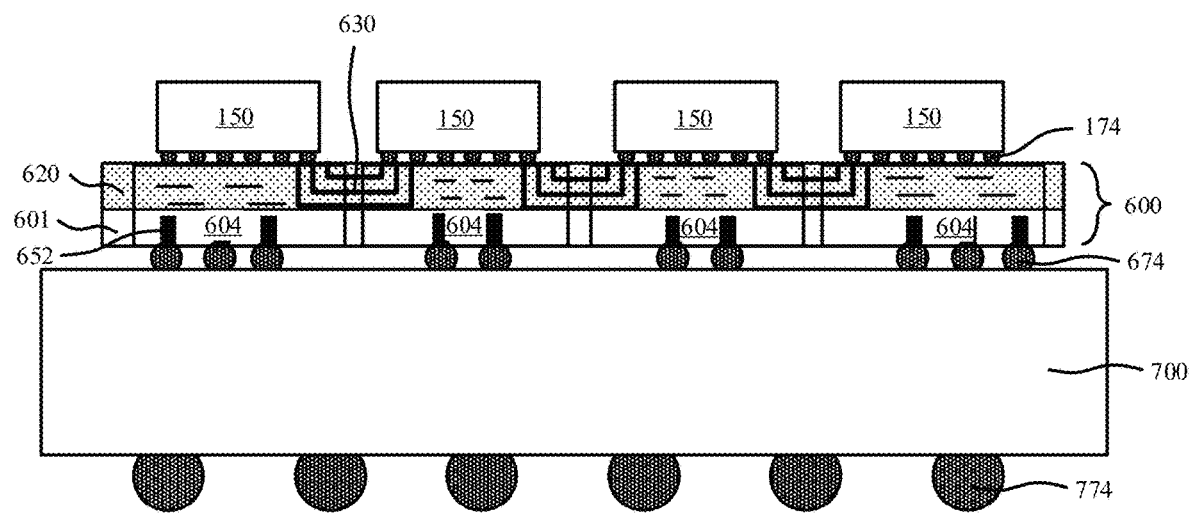
FIG. 17A is a schematic cross-sectional side view illustration of a module including a plurality of dies mounted on an interposer with connected routing areas in accordance with an embodiment.
Figure 17B:
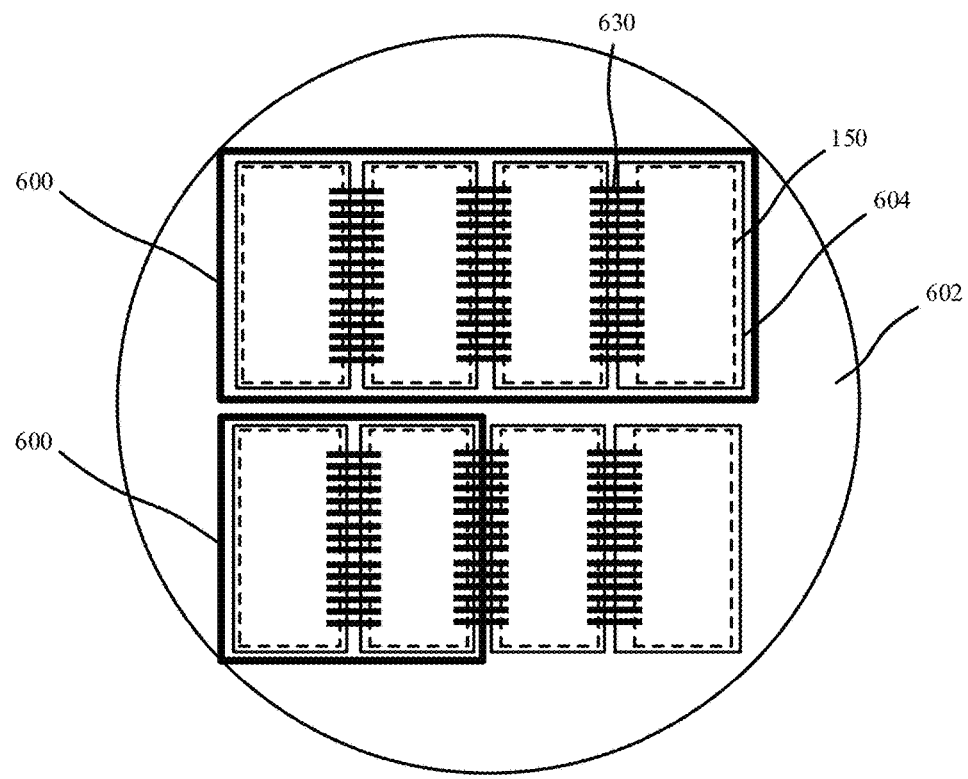
FIG. 17B is a schematic top view illustration of scribe areas on an interposer substrate with connected routing areas in accordance with an embodiment.

Similar solutions can also be used to harvest custom tiled interposer arrays. FIG. 17A is a schematic cross-sectional side view illustration of a module including a plurality of chips 150 mounted on an interposer 600 with connected routing areas 630 in accordance with an embodiment. FIG. 17B is a schematic top view illustration of scribe areas on an interposer substrate 602 with connected routing areas 630 in accordance with an embodiment. Similar to previous embodiments, sections 604 can be provisioned in a substrate 601, such as silicon substrate, and yielding sections 604 can be custom scribed to form interposers 600. The interposers 600 may include TSVs 652 for vertical connection. Routing areas 630 may be formed in a routing layer 620 similar to routing layer 520. In an exemplary application, such a configuration can be utilized form a field programmable gate array (FPGA), including chips 150 mounted on the interposer 600 with conductive bumps 174 (e.g. microbumps), with the interposer 600 mounted onto a package substrate with conductive bumps 674. Ball grid array (BGA) balls 774 may be placed on the opposite side of the package substrate 700 for further integration.

Up until this custom harvesting of various arrayed structures has been described. In many circumstances, conventional dicing techniques including blade dicing and laser ablation may be performed along pre-determined streets or dicing areas between arrayed areas. In accordance with embodiments programmable dicing techniques can also be employed to provide additional flexibility into selection of dicing areas, and to support fine dicing with reduced street width or loss of material. Two such programmable dicing techniques include laser assisted dicing (which can include laser ablation or stealth dicing, which is cleaner, less damaging, and may have a smaller scribe) and chemical etch dicing (which can be wet or plasma based).

Figure 18:
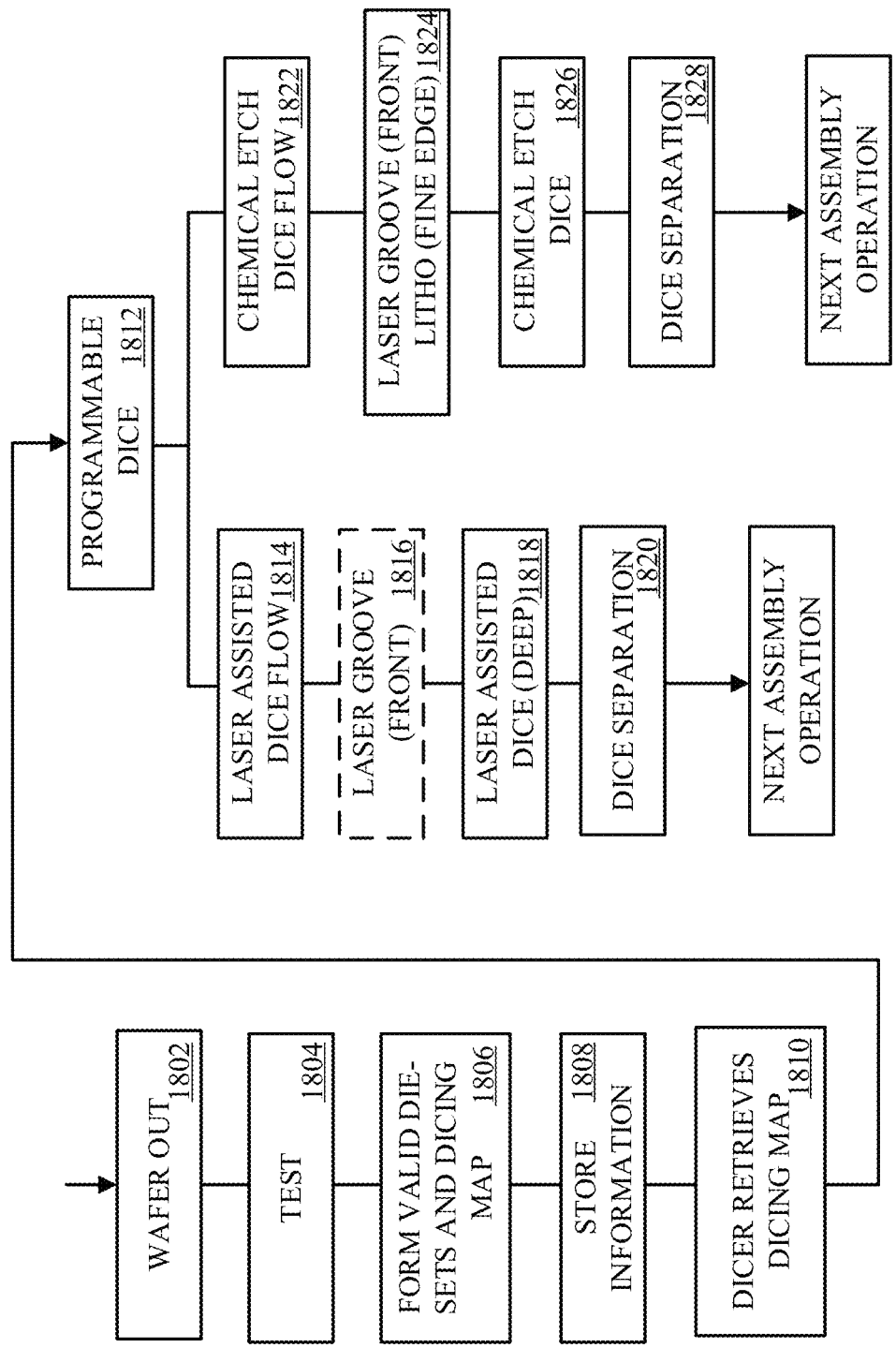
FIG. 18 is a flow chart of a method of testing and scribing dies with programmable dicing in accordance with embodiments.

FIG. 18 is a flow chart of a method of testing and scribing dies with programmable dicing in accordance with embodiments. Beginning with operation 1802 the arrayed wafer including FEOL die areas and routing layers to complete die-to-die routing is received. The wafer can then be tested at operation 1804 to determine good and bad FEOL die areas. This information is then used to create a map at operation 1806 identifying valid die sets 100, and the map information is then stored at operation 1808. A dicing tool then retrieves the map at operation 1810 and can perform programmable dicing at operation 1812, which may include a laser assisted dice flow sequence 1814 or chemical etch dice flow sequence 1822 for example.

A laser assisted dice flow sequence 1814 can optionally include laser grooving the front side of the wafer at operation 1816. For example, this may be a first laser cutting process (e.g. ablation) through the routing layers/BEOL build-up structure down to substrate. Thus, this can include cutting through die-to-die routing 130 for example. Deep laser assisted dicing operation 1818 is then performed where a laser beam is pulsed on and off to create line of damaged crystal structure. The dies are then separated at operation 1820. This may include cleaving to propagate cracks along the laser pattern.

A chemical etch dice flow sequence 1822 can include a programmable laser groove operation 1824 similar to sequence 1814 where a laser is used to cut through the routing layers/BEOL build-up structure down to substrate. A mask layer can be deposited, and the patterned with a laser cutting (e.g. ablation), through both the mask layer and the BEOL build-up structure. This may avoid an additional lithography operation, and can be well defined (e.g. <1 µm edge). Plasma or wet chemical assist dicing may then be performed at operation 1826, where an etch mask may be lithographically defined, followed by a plasma or wet etch partially or completely through the semiconductor substrate. The dies can then be separated at operation 1828. Where partial plasma or wet etching was performed, this may optionally include back-grinding the semiconductor substrate.

Either programmable dicing technique can be used to achieve fine dicing, with mitigated material loss. This facilitates integration of dense arrayed structures. Additionally, the programmable dicing techniques are very flexible for shape, size or layout constraints. This allows the freedom to dice die sets of any shape. This ability thus allows additional reliability margin improvements to the diced die sets to be realized with programmable dicing in accordance with embodiments.

Figure 19A:
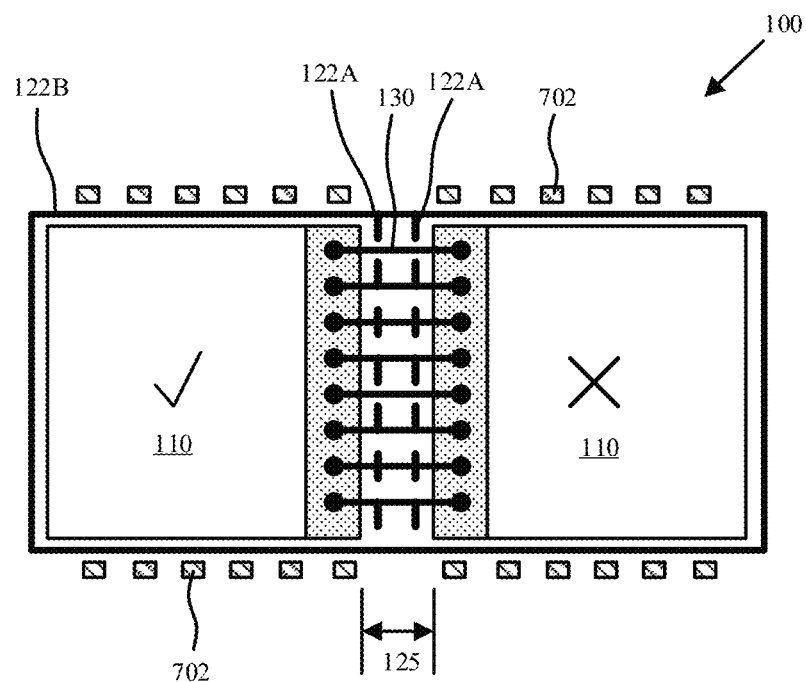
FIG. 19A is a schematic top view illustration of a die set before scribing in accordance with an embodiment in which the FEOL die area sets are interconnected with die-to-die routing through partial metallic seal rings.

Referring now to FIG. 19A, a schematic top view illustration is provided of a die set 100 before scribing in accordance with an embodiment in which the FEOL die areas 110 are interconnected with die-to-die routing 130 through partial metallic seals 122A. A full metallic seal 122B is also provided around the die set 100. Thus, this exemplary arrangement may be a pre-arranged die set 100 previously described with regard to FIG. 1C. It is to be appreciated however, that this particular configuration is exemplary, and the following structures for reliability margin improvements can be integrated into other die set 100 configurations.

The die areas in accordance with embodiments may have corresponding service structures 702 used for wafer acceptance testing, process statistics, etc. to monitor the wafer fabrication processes, alignment, etc. As such, these services structures 702 can commonly be located along die and reticle edges.

Figure 19B:
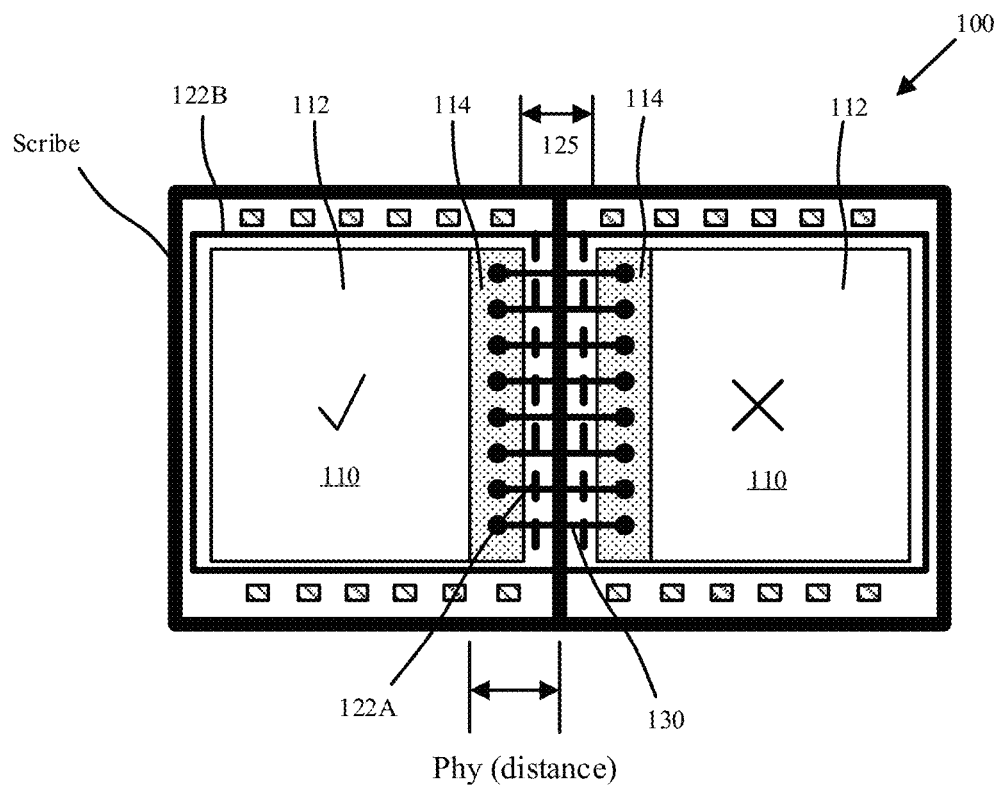
FIG. 19B is a schematic top view illustration of a scribe line through die-to-die routing between adjacent FEOL die areas in accordance with an embodiment.

Still referring to FIG. 19A, service structures 702 can be arranged outside the metallic seals (e.g. outside full metallic seal 122B ring). Various service structures may include electrical test pads for testing and binning good/bad wafer acceptance test, or for controlling process statistics for tuning, as well as alignment features, and may be formed as part of the BEOL build-up structure. As shown in FIG. 19A, one of the FEOL die areas 110 has been tested and found to be defective. The programmable dicing methods in accordance with embodiments can be used to scribe out the defective FEOL die area 110 as shown in FIG. 19B, and recover the good die thereby improving margins. For example, the resulting structure may be similar to that of FIG. 5B. Scribing may optionally remove the service structures 702. Alternatively, the service structures 702 can be retained in the die set 100 after scribing.

Figure 20A:
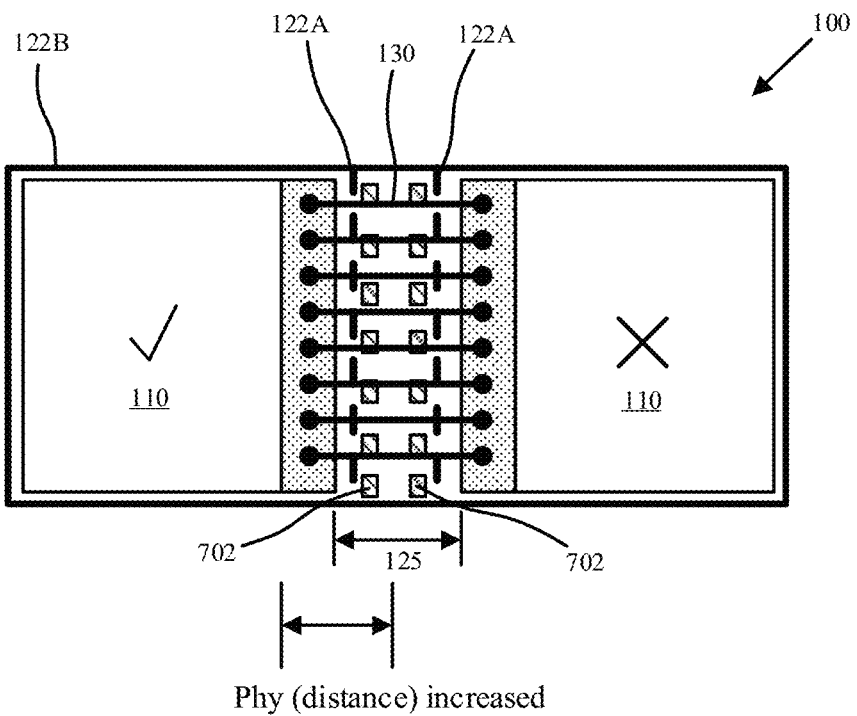
FIG. 20A is a schematic top view illustration of a die set before scribing in accordance with an embodiment with service structures located in an unscribed scribe area between adjacent FEOL die areas.
Figure 20B:
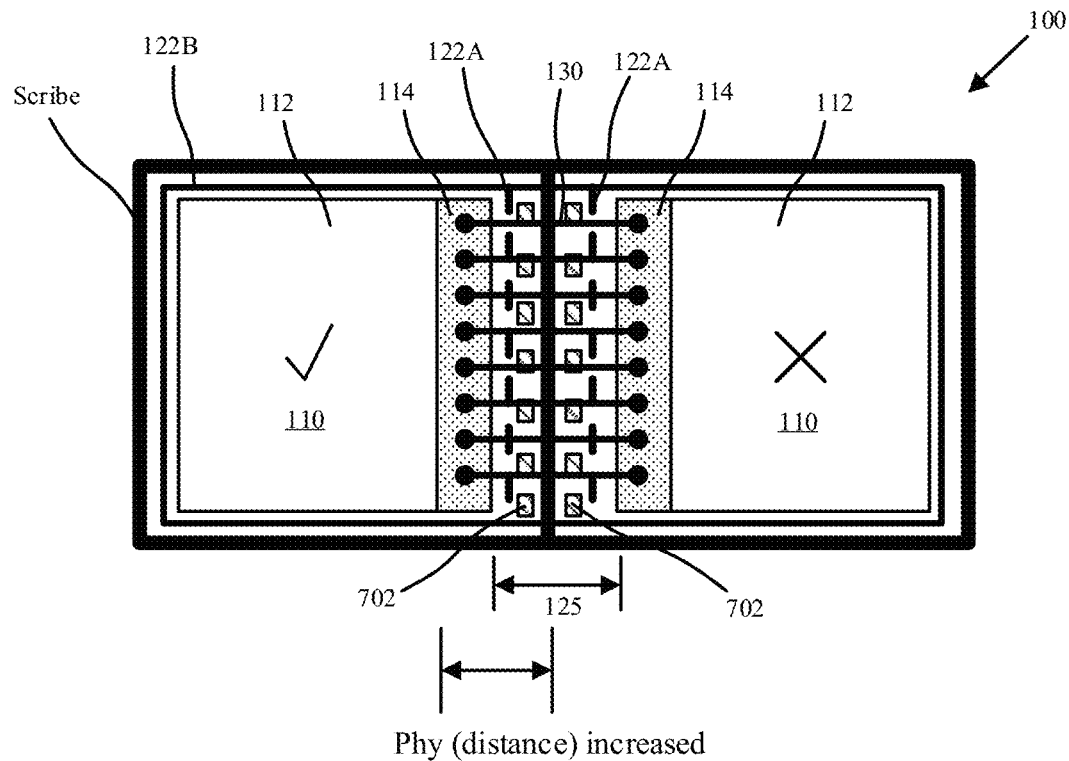
FIG. 20B is a schematic top view illustration of a scribed die set in accordance with an embodiment with service structures located in a scribed scribe area between adjacent FEOL die areas.

Referring now to FIG. 20A a schematic top view illustration is provided of a die set 100 before scribing in accordance with an embodiment with service structures 702 located in an unscribed scribe area 125 between adjacent FEOL die areas. This may not include all service structure 702, though they may be relocated to a degree possible. In this instance the service structures 702 are located between the FEOL die areas 110, which can result in an increased physical interface (Phy) distance. The service structures 702 may be located above, under, or between (laterally, vertically) the die-to-die routing 130 lines. Referring now to FIG. 20B, in a circumstance where one of the dies is bad, and a good die is recovered from the die set 100 scribing can be performed between the service structures 702 for each FEOL die area 110. As a result, Phy distance is increased along this die edge to the active device area, which can help increase reliability and margin of the recovered die since moisture, ions, and cracks would need to propagate a longer distance. Thus, the original function of the service structures 702 can be retained, while the increased physical distance can help improve reliability of the partial metallic seal 122A structures. In an embodiment, the die-to-die routing 130 lines, which have been cut, are electrically isolated. Isolation can include being tristated, or otherwise being disconnected from the core circuits of the die. This applies to both die-to-die routing 130 as well as to any supporting power networks.

Figure 21:
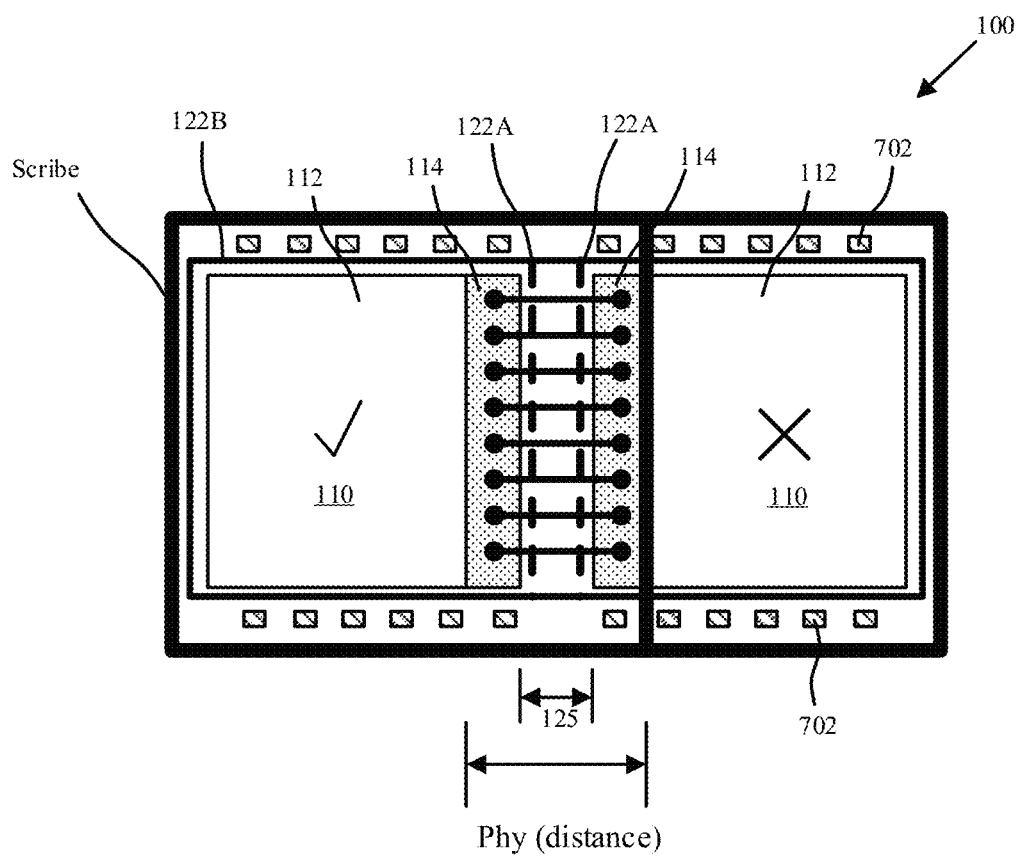
FIG. 21 is a schematic top view illustration of a scribed die set in accordance with an embodiment with scribe line on an opposite side of an input/output region of an adjacent FEOL die area in accordance with an embodiment.

FIG. 21 is a schematic top view illustration of a scribed die set in accordance with an embodiment with scribe line on an opposite side of an input/output region 114 of an adjacent FEOL die area 110 in accordance with an embodiment. In such an embodiment, programmable dicing can be used to provide additional protection to moisture, ions, and cracks by including multiple partial metallic seals 122A, and optionally a portion of the adjacent FEOL die area 110 such as the input/output region 114. As shown, dicing is through the bad die area 110. Thus, space is borrowed from the bad die to improve reliability, by increasing distance, the number of partial metallic seals, and preserving an undamaged die-to-die routing 130. In an embodiment, internal input/output region 114 in the FEOL die area 110 is isolated in an off state where connected to a BEOL build-up structure contact pad, which can allow for external contact to be made with the additional input/output region 114 that remains connected with the die-to-die routing 130. Isolation in the off state can include being tristated, or the external die-to-die routing 130 otherwise being disconnected from the core circuits of the die. This may be just connected to a wire going to the other die. It may not go to a contact pad or any other pad. What is needed is to have the ability to isolate the buffer (transceiver or receiver) if the die-to-die routing 130 is cut.

Figure 22:
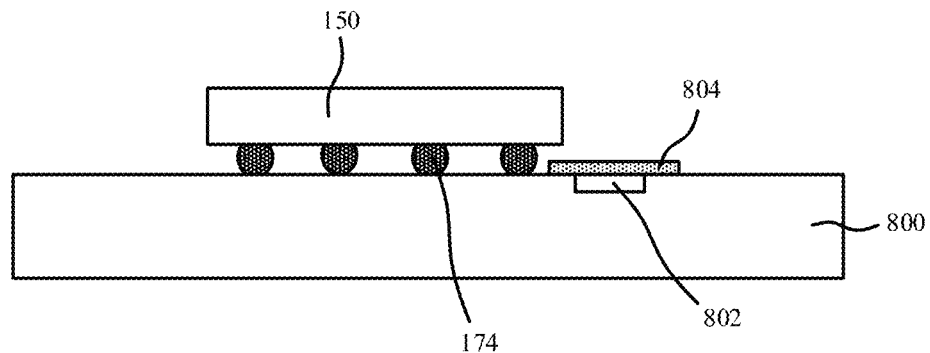
FIG. 22 is a schematic side view illustration of a chip mounted on a routing substrate including a covered bond pad in accordance with an embodiment.

Such a recovered die configuration can be designed into an end module application to accommodate the potential for additional chip 150 area, and extra conductive bump. For example, FIG. 22 illustrates a normal chip 150 mounted on a routing substrate 800 that includes an additional unopened bond pad(s) 802, which can be covered with an insulating layer 804. Where the chip 150 includes a recovered die with additional scribe area 125 and additional input/output region 114, the bond pad(s) 802 can be opened by removal of the insulating layer, and additional conductive bumps 184 can be applied. In this manner, the die-to-die routing 130 can also be preserved.

Figure 23:
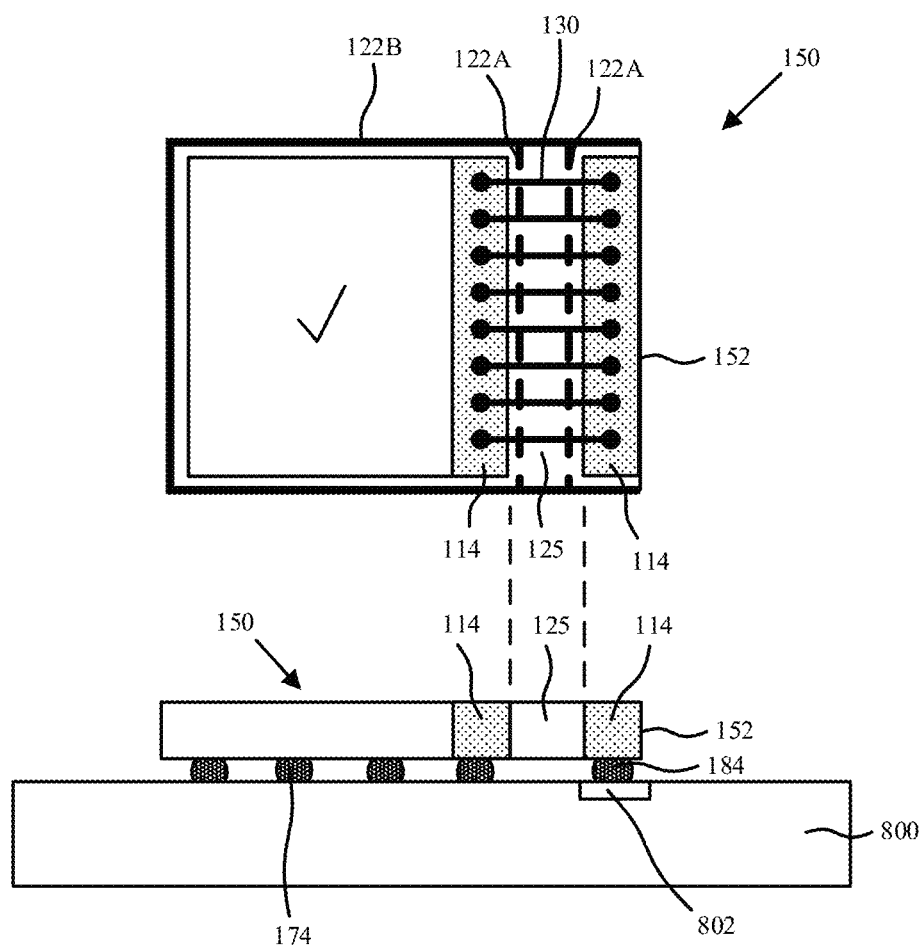
FIG. 23 is a schematic side view illustration of the chip including the scribed die set of FIG. 21 mounted on a routing substrate with a conductive bump underneath the additional input/output region in accordance with an embodiment.

In an embodiment, a chip structure includes a semiconductor substrate 101, a first FEOL die area 110A of a first die 104A patterned into the semiconductor substrate 101. The first FEOL die area 110A includes a first device area 112 and a first input/output region 114. A scribe area 125 is adjacent to the first input/output region 114. A second input output region 114 is also patterned into the semiconductor substrate adjacent to the scribe area 125 opposite the first input/output region 114. A BEOL build-up structure 120 spans over the first device area 112, the first input/output region 114, the scribe area 125, and the second input/output region 114. The BEOL build up structure 120 additionally includes die-to-die routing 130 connecting the first input/output region 114 and the second input/output region 114. In an embodiment, a scribed chip edge 152 may be adjacent to the second input/output region 114, as illustrated in FIG. 23. Since the die-to-die routing 130 is preserved, the first input/output region can be isolated in an off state (e.g. tristated) where connected to a BEOL build-up structure contact pad 140. This may be just connected to a wire going to the other die. It may not go to a contact pad or any other pad. What is needed is to have the ability to isolate the buffer (transceiver or receiver) if the die-to-die routing 130 is cut. Partial metallic seals 122A can also be located adjacent to the first input/output region 114 and the second input/output region 114, with the die-to-die routing 130 extending through first openings in the first partial metallic seal 122A and second openings in the second partial metallic seal 122A. Service structures 702 can additionally be in the scribe area 125 between the first input/output region 114 and the second input/output region 114.

In utilizing the various aspects of the embodiments, it would become apparent to one skilled in the art that combinations or variations of the above embodiments are possible for harvesting arrayed structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A multi-die structure comprising:
   a first front-end-of-the line (FEOL) die area of a first die patterned into a semiconductor substrate and a second FEOL die area of a second die patterned into the semiconductor substrate, the second FEOL die area separate from the first FEOL die area;
   wherein the first FEOL die area includes a first input/output region, and the second FEOL die area includes a second input/output region;
   a back-end-of-the-line (BEOL) build-up structure spanning over the first FEOL die area and the second FEOL die area, the BEOL build-up structure comprising:
   a first partial metallic seal adjacent to the first input/output region;
   a second partial metallic seal adjacent to the second input/output region;
   a die-to-die routing connecting the first input/output region and the second input/output region and extending through first openings in the first partial metallic seal and second openings in the second partial metallic seal; and
   a metallic seal ring completely around the first FEOL die area, the second FEOL die area, and the die-to-die routing.

2. The multi-die structure of claim 1, wherein the first die and the second die are both network dies.

3. The multi-die structure of claim 1, wherein the first die and the second die are each selected from the group consisting of a graphics processing unit (GPU), a central processing unit (CPU), a neural engine, an artificial intelligence (AI) engine, and a signal processor.

4. The multi-die structure of claim 1, wherein the BEOL build-up structure further comprises a plurality of service structures between the first input/output region and the second input/output region.

5. A multi-die structure comprising:
   a routing substrate;
   a logic chip mounted on the routing substrate;
   a chip mounted on the routing substrate adjacent to the logic chip, wherein the chip comprises:
   a first front-end-of-the line (FEOL) die area of a first die patterned into a semiconductor substrate and a second FEOL die area of a second die patterned into the semiconductor substrate, the second FEOL die area separate from the first FEOL die area;
   wherein the first FEOL die area includes a first input/output region and a third input/output region, and the second FEOL die area includes a second input/output region;
   a back-end-of-the-line (BEOL) build-up structure spanning over the first FEOL die area and the second FEOL die area, the BEOL build-up structure comprising:
   a first partial metallic seal adjacent to the first input/output region;
   a second partial metallic seal adjacent to the second input/output region; and a die-to-die routing connecting the first input/output region and the second input/output region and extending through first openings in the first partial metallic seal and second openings in the second partial metallic seal;

wherein the third input/output region is located adjacent to the logic chip and is electrically connected with the logic chip with routing substrate wiring.

6. The multi-die structure of claim 5, wherein the first die and the second die are each independently selected from the group consisting of static random-access memory, magnetic random-access memory, nonvolatile random-access memory, dynamic random-access memory, NAND, and cache memory.

7. The multi-die structure of claim 5, wherein the first die is a memory cache die, and the second die is a memory die.

8. The multi-die structure of claim 5, wherein the first die includes a data buffer not included in the second die.

9. The multi-die structure of claim 5, wherein the first die is a controller memory die configured to communicate with the logic chip and the second die is a service memory die configured to communicate with the logic chip through the controller memory die.

10. A multi-die structure comprising:
a first front-end-of-the line (FEOL) die area of a first die patterned into a semiconductor substrate and a second FEOL die area of a second die patterned into the semiconductor substrate, the second FEOL die area separate from the first FEOL die area;
wherein the first FEOL die area includes a first input/output region, and the second FEOL die area includes a second input/output region;
a back-end-of-the-line (BEOL) build-up structure spanning over the first FEOL die area and the second FEOL die area, the BEOL build-up structure comprising:
a first partial metallic seal adjacent to the first input/output region;
a second partial metallic seal adjacent to the second input/output region; and
a die-to-die routing connecting the first input/output region and the second input/output region and extending through first openings in the first partial metallic seal and second openings in the second partial metallic seal;
wherein the semiconductor substrate, the first FEOL die area, second FEOL die area, and BEOL build-up structure form a first die level; and
a second die level hybrid bonded to the first die level, the second die level including a third front-end-of-the line (FEOL) die area of a third die patterned into a second semiconductor substrate and a fourth FEOL die area of a fourth die patterned into the second semiconductor substrate, the fourth FEOL die area separate from the third FEOL die area.

11. The multi-die structure of claim 10, wherein the semiconductor substrate of the first die level is bonded to a second BEOL build-up structure of the second die level spanning over the third FEOL die area and the fourth FEOL die area.

12. The multi-die structure of claim 11, further comprising a plurality of through silicon vias extending through the semiconductor substrate.

13. The multi-die structure of claim 11, wherein the second BEOL build-up structure of the second die comprises a second die-to-die routing connecting the third FEOL die area and the fourth FEOL die area.

14. The multi-die structure of claim 13, wherein the second die-to-die routing extends through a third partial metallic seal adjacent the third FEOL die area, and a fourth partial metallic seal adjacent the fourth FEOL die area.

* * * * *